(12) United States Patent
Hirase et al.

(10) Patent No.: US 12,342,643 B2
(45) Date of Patent: Jun. 24, 2025

(54) IMAGING APPARATUS

(71) Applicant: Panasonic Intellectual Property Management Co., Ltd., Osaka (JP)

(72) Inventors: Junji Hirase, Osaka (JP); Masaaki Yanagida, Kyoto (JP); Kazuko Nishimura, Kyoto (JP); Yoshinori Takami, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 526 days.

(21) Appl. No.: 17/695,422

(22) Filed: Mar. 15, 2022

(65) Prior Publication Data

US 2022/0208816 A1 Jun. 30, 2022

Related U.S. Application Data

(63) Continuation of application No. PCT/JP2020/035645, filed on Sep. 18, 2020.

(30) Foreign Application Priority Data

Oct. 4, 2019 (JP) .................. 2019-183830

(51) Int. Cl.
*H04N 25/65* (2023.01)
*H10F 39/00* (2025.01)
(Continued)

(52) U.S. Cl.
CPC ......... *H10F 39/8037* (2025.01); *H04N 25/65* (2023.01); *H04N 25/745* (2023.01); *H04N 25/75* (2023.01)

(58) Field of Classification Search
CPC . H01L 27/14612; H01L 27/146; H04N 25/65; H04N 25/745; H04N 25/75; H04N 25/76; H04N 25/78
See application file for complete search history.

(56) References Cited

U.S. PATENT DOCUMENTS

2014/0002704 A1 1/2014 Kido
2015/0288898 A1 10/2015 Yazawa et al.
(Continued)

FOREIGN PATENT DOCUMENTS

JP 2010-171439 8/2010
JP 2011-146516 7/2011
(Continued)

OTHER PUBLICATIONS

International Search Report of PCT application No. PCT/JP2020/035645 dated Nov. 24, 2020.

*Primary Examiner* — Tony Ko
(74) *Attorney, Agent, or Firm* — Rimon P.C.

(57) ABSTRACT

An imaging apparatus comprises a semiconductor substrate, a photoelectric converter, a charge storage region, and an amplification transistor. The photoelectric converter includes a pixel electrode, a counter electrode, and a photoelectric conversion layer. The photoelectric conversion layer is positioned above the semiconductor substrate and is disposed between the pixel electrode and the counter electrode. Charge generated by the photoelectric converter is stored in the charge storage region. The amplification transistor includes a source, a drain, and a gate electrode. The gate electrode is electrically connected to the charge storage region. In a plan view, the width of the drain of the amplification transistor is less than the width of the source of the amplification transistor.

17 Claims, 16 Drawing Sheets

(51) Int. Cl.
   *H04N 25/71*     (2023.01)
   *H04N 25/75*     (2023.01)

(56)     References Cited

U.S. PATENT DOCUMENTS

2018/0352181 A1    12/2018  Nishikawa et al.
2020/0105808 A1*    4/2020  Tagawa ............. H01L 27/14636
2020/0366860 A1    11/2020  Shishido

FOREIGN PATENT DOCUMENTS

| JP | 2014-011253    | 1/2014  |
| JP | 2016-058633    | 4/2016  |
| JP | 2017-163614    | 9/2017  |
| JP | 2018-182709    | 11/2018 |
| JP | 2018-207100 A  | 12/2018 |
| WO | 2019/167551 A1 | 9/2019  |

* cited by examiner $Wd = Wd1 + Wd2$ $Wd = Wd1 + Wd2 + Wd3 + Wd4$

ABSOLUTE VALUE OF EFFECTIVE CONCENTRATION (NET PROFILE)

CURRENT DENSITY DISTRIBUTION
($V_g/V_d/V_s/V_b$ = 1/2.6/0/−0.7 V)

IMAGING APPARATUS

BACKGROUND

1. Technical Field

The present disclosure relates to an imaging apparatus.

2. Description of the Related Art

Image sensors are used in devices such as digital cameras. Examples of image sensors include charge-coupled device (CCD) image sensors and complementary metal-oxide-semiconductor (CMOS) image sensors.

In an image sensor according to one example, a photodiode is provided on a semiconductor substrate.

In an image sensor according to a different example, a photoelectric conversion layer is provided in the upper part of a semiconductor substrate. An imaging apparatus having such a structure may be referred to as a multilayer imaging apparatus.

In a multilayer imaging apparatus according to a specific example, a signal charge is produced by photoelectric conversion. The produced charge is stored in a charge storage node. A signal corresponding to the quantity of charge stored in the charge storage node is read out through a CCD circuit or a CMOS circuit formed on the semiconductor substrate.

An imaging apparatus is described in Japanese Unexamined Patent Application Publication No. 2010-171439.

SUMMARY

In one general aspect, the techniques disclosed here feature an imaging apparatus comprising: a semiconductor substrate; a photoelectric converter including a pixel electrode, a counter electrode, and a photoelectric conversion layer positioned above the semiconductor substrate and disposed between the pixel electrode and the counter electrode; a charge storage region that stores charge generated by the photoelectric converter; and an amplification transistor including a first source, a first drain, and a gate electrode electrically connected to the charge storage region. In a plan view, a width of the first drain is less than a width of the first source.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
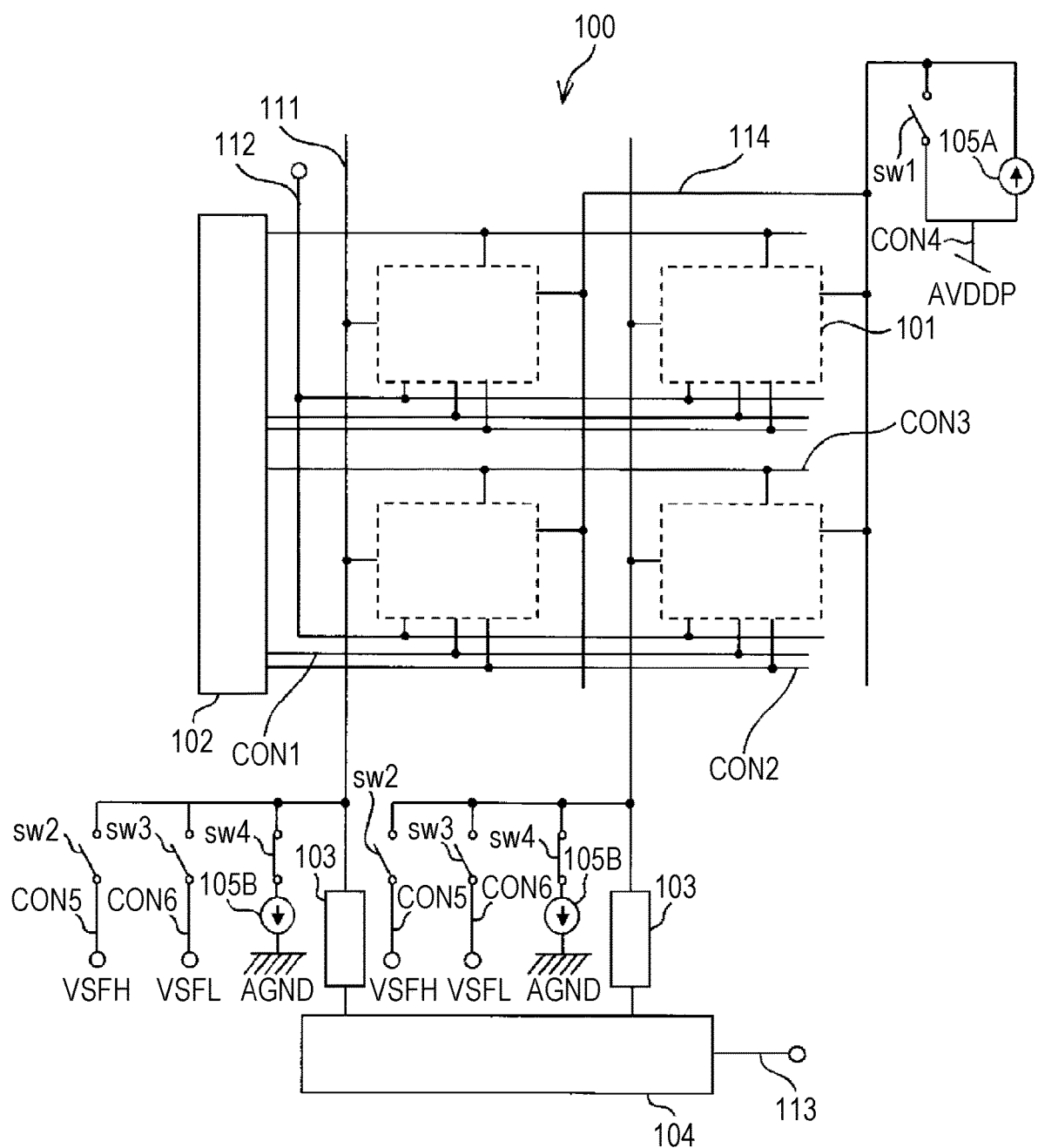
FIG. 1 is a circuit diagram illustrating a circuit configuration of an imaging apparatus.

DETAILED DESCRIPTION (Overview of Aspects According to Present Disclosure)

An imaging apparatus according to a first aspect of the present disclosure comprises:

a semiconductor substrate;

a photoelectric converter including a pixel electrode, a counter electrode, and a photoelectric conversion layer positioned above the semiconductor substrate and disposed between the pixel electrode and the counter electrode;

a charge storage region that stores charge generated by the photoelectric converter; and an amplification transistor including a first source, a first drain, and a gate electrode electrically connected to the charge storage region. In a plan view, a width of the first drain is less than a width of the first source.

The first aspect is suitable for achieving a fast imaging apparatus with low noise.

In a second aspect of the present disclosure, for example, in the imaging apparatus according to the first aspect, in a plan view, a distance from the first drain of the amplification transistor to the charge storage region may be greater than a distance from the first source of the amplification transistor to the charge storage region.

The second aspect is suitable for achieving an imaging apparatus with low noise.

In a third aspect of the present disclosure, for example, in the imaging apparatus according to the first or second aspect, the amplification transistor and the charge storage region may be arranged such that an output signal from the amplification transistor is provided to the charge storage region as negative feedback.

According to the third aspect, highly efficient noise canceling can be achieved in concert with the magnitude relationship of the dimensions of the first aspect.

In a fourth aspect of the present disclosure, for example, the imaging apparatus according to any one of the first to third aspects may further comprise a select transistor, including a second source and a second drain, that determines a timing at which the amplification transistor outputs an output signal. In a plan view, a width of at least one selected from the group consisting of the second source and the second drain may be less than the width of the first drain of the amplification transistor.

The fourth aspect is excellent from the perspective of suppressing capacitive coupling in the select transistor.

In a fifth aspect of the present disclosure, for example, in the imaging apparatus according to any one of the first to fourth aspects, on a surface of the semiconductor substrate,
a p-n junction including a portion of an outline of the first source of the amplification transistor, a portion of an outline of the first drain of the amplification transistor, a first line joining the first source and the first drain, and a second line joining the first source and the first drain may be formed, and an area of a region between the first line and the second line may be greater than an area of a region between a first straight line joining both ends of the first line and a second straight line joining both ends of the second line.

The fifth aspect is suitable for securing a wide current path.

In a sixth aspect of the present disclosure, for example, in the imaging apparatus according to any one of the first to fourth aspects, the amplification transistor may be a depletion-mode transistor, and the amplification transistor may include an implantation region including an impurity of the same conductivity type as the conductivity type of an impurity included in the first source and the first drain of the amplification transistor, the implantation region being connected to the first source and the first drain of the amplification transistor.

The sixth aspect is effective from the perspective of raising the operating efficiency of the amplification transistor.

In a seventh aspect of the present disclosure, for example, in the imaging apparatus according to any one of the first to sixth aspects, the amplification transistor may include an implantation region connected to the first source and the first drain, and on a surface of the semiconductor substrate, an average width of the implantation region may be greater than an average of the width of the first source of the amplification transistor and the width of the first drain of the amplification transistor.

The seventh aspect is suitable for securing a wide current path.

An imaging apparatus according to an eighth aspect of the present disclosure comprises:
a semiconductor substrate;
a photoelectric converter positioned in the semiconductor substrate;
a charge storage region that stores charge generated by the photoelectric converter; and
an amplification transistor including a first source, a first drain, and a gate electrode electrically connected to the charge storage region. In a plan view,
a width of the first drain is less than a width of the first source, and
a distance from the first drain to the charge storage region is greater than a distance from the first source to the charge storage region.

The eighth aspect is suitable for achieving a fast imaging apparatus with low noise.

In a ninth aspect of the present disclosure, for example, in the imaging apparatus according to the eighth aspect, the amplification transistor and the charge storage region may be arranged such that an output signal from the amplification transistor is provided to the charge storage region as negative feedback.

According to the ninth aspect, highly efficient noise canceling can be achieved in concert with the magnitude relationship of the dimensions of the eighth aspect.

In a 10th aspect of the present disclosure, for example, the imaging apparatus according to the eighth or ninth aspect may further comprise a select transistor, including a second source and a second drain, that determines a timing at which the amplification transistor outputs an output signal. In a plan view, a width of at least one selected from the group consisting of the second source and the second drain may be less than the width of the first drain of the amplification transistor.

The 10th aspect is excellent from the perspective of suppressing capacitive coupling in the select transistor.

In an 11th aspect of the present disclosure, for example, in the imaging apparatus according to any one of the eighth to 10th aspects, on a surface of the semiconductor substrate,
a p-n junction including a portion of an outline of the first source of the amplification transistor, a portion of an outline of the first drain of the amplification transistor, a first line joining the first source and the first drain, and a second line joining the first source and the first drain may be formed, and an area of a region between the first line and the second line may be greater than an area of a region between a first straight line joining both ends of the first line and a second straight line joining both ends of the second line.

The 11th aspect is suitable for securing a wide current path.

In a 12th aspect of the present disclosure, for example, in the imaging apparatus according to any one of the eighth to 11th aspects, the amplification transistor may be a depletion-mode transistor, and the amplification transistor may include an implantation region including an impurity of the same conductivity type as the conductivity type of an impurity included in the first source and the first drain of the amplification transistor, the implantation region being connected to the first source and the first drain of the amplification transistor.

The 12th aspect is effective from the perspective of raising the operating efficiency of the amplification transistor.

In a 13th aspect of the present disclosure, for example, in the imaging apparatus according to any one of the eighth to 12th aspects, the amplification transistor may include an implantation region connected to the first source and the first drain, and on a surface of the semiconductor substrate, an average width of the implantation region may be greater than an average of the width of the first source of the amplification transistor and the width of the first drain of the amplification transistor.

The 13th aspect is suitable for securing a wide current path.

In a 14th aspect of the present disclosure, for example, in the imaging apparatus according to any one of the first to seventh aspects, the first source and the first drain of the amplification transistor may be configured not to switch functions of the first source and the first drain with each other while in operation.

In a 15th aspect of the present disclosure, for example, in the imaging apparatus according to any one of the first to 14th aspects, the imaging apparatus may be configured such that a direct-current potential is supplied to the first drain of the amplification transistor.

In a 16th aspect of the present disclosure, for example, in the imaging apparatus according to any one of the eighth to 13th aspects, the first source and the first drain of the amplification transistor may be configured not to switch functions of the first source and the first drain with each other while in operation.

In a 17th aspect of the present disclosure, for example, in the imaging apparatus according to any one of the eighth to 16th aspects, the imaging apparatus may be configured such that a direct-current potential is supplied to the first drain of the amplification transistor.

An imaging apparatus according to an 18th aspect of the present disclosure comprises:

a photoelectric converter;

a charge storage region that stores charge generated by the photoelectric converter; and an amplification transistor including a source, a drain, and a gate electrode electrically connected to the charge storage region. In a plan view, a width of the drain of the amplification transistor is less than a width of the source of the amplification transistor.

Hereinafter, embodiments of the present disclosure will be described in detail and with reference to the drawings. Note that the embodiments described hereinafter all illustrate general or specific examples. Features such as numerical values, shapes, materials, structural elements, arrangements and connection states of structural elements, steps, and the ordering of steps indicated in the following embodiments are merely examples, and are not intended to limit the present disclosure. The various modes described in this specification may also be combined with each other in non-contradictory ways. In the following description, structural elements having substantially the same functions will be denoted by shared reference signs, and the description of such structural elements may be reduced or omitted.

It should be noted that general or specific aspects may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

In this specification, ordinals such as first, second, third, and so on may be used. If a certain numeral is denoted with an ordinal, it is not necessarily the case that an element of the same type with a lower numeral exists. The numerals of the ordinals may be changed as necessary.

The transistor polarity and the conductivity type of the diffusion region in the embodiments hereinafter are examples. The transistor polarity and the conductivity type of the diffusion region may also be inverted as long as there is no contradiction.

<Structure of Imaging Apparatus 100>

FIG. 1 illustrates the structure of an imaging apparatus 100 according to the present embodiment. The structure of the imaging apparatus 100 will be described with reference to FIG. 1.

The imaging apparatus 100 is provided with a plurality of pixels 101 and a peripheral circuit.

Pixel regions are formed by the plurality of pixels 101. In the present embodiment, the plurality of pixels 101 are arranged two-dimensionally.

Specifically, in the example of FIG. 1, the plurality of pixels 101 are arrayed in a row direction and a column direction. The row direction is the direction in which rows extend. The column direction is the direction in which columns extend. In FIG. 1, the vertical direction is the column direction. The horizontal direction is the row direction.

However, the plurality of pixels 101 may also be arrayed one-dimensionally. In this case, the imaging apparatus 100 may be a line sensor.

The imaging apparatus 100 is provided with a signal line CON1, a signal line CON2, a signal line CON3, a power line CON4, a power line CON5, a power line CON6, a signal line 111, a signal line 114, and a power line 112.

The signal line CON1, the signal line CON2, and the signal line CON3 are disposed in each row.

The signal line 111 is disposed in each column. The signal line 111 in each column is connected to the pixels 101 in that column. A constant current source 105B may be connected to the signal line 111 of each column. A voltage VSFH may be applied to the signal line 111 of each column. A voltage VSFL may be applied to the signal line 111 of each column. The voltage VSFH is higher than the voltage VSFL.

The signal line 114 is connected to each pixel 101. The signal line 114 is connected to a constant current source 105A. Also, a voltage AVDDP may be applied to the signal line 114.

The voltage VSFH is a power supply voltage, for example. The voltage VSFL is a ground voltage, for example. The voltage AVDDP is a power supply voltage, for example.

In the example of FIG. 1, the pixels 101 and the constant current source 105A are continuously electrically connected. However, the pixels 101 and the constant current source 105A may also be connected through a switch.

A reference voltage Vp is applied to the power line 112. The power line 112 supplies the reference voltage Vp to all of the pixels 101.

The peripheral circuit includes a vertical scan circuit 102, a column signal processing circuit 103, a horizontal signal readout circuit 104, the constant current source 105A, and the constant current source 105B.

The column signal processing circuit 103 and the constant current source 105B are disposed in each column of the pixels 101 arrayed two-dimensionally, for example.

The vertical scan circuit 102 is connected to the signal line CON1, the signal line CON2, and the signal line CON3.

The vertical scan circuit 102 applies a predetermined voltage to the signal line CON1, and selects a plurality of the pixels 101 disposed in each row in units of rows. With this arrangement, a readout of the signal voltage from the selected pixels 101 and a reset of a pixel electrode 121b are executed.

The pixels 101 disposed in each column are electrically connected to the column signal processing circuit 103 through the signal line 111 of the column to which the pixels 101 belong. The column signal processing circuit 103 performs noise suppression signal processing, analog-to-digital conversion (AD conversion), and the like. The noise suppression signal processing is correlated double sampling, for example.

The horizontal signal readout circuit 104 is electrically connected to the plurality of column signal processing circuits 103 provided in correspondence with a plurality of columns. The horizontal signal readout circuit 104 sequentially reads out the signals outputted from the plurality of column signal processing circuits 103 to a horizontal signal common line 113.

The vertical scan circuit 102 is also referred to as a row scan circuit. The column signal processing circuit 103 is also referred to as a row signal storage circuit. The horizontal signal readout circuit 104 is also referred to as a column scan circuit.

The voltage AVDDP is generated by a power source not illustrated and is applied to the power line CON4. The power line CON4 is connected to the signal line 114 through a first switch sw1. Additionally, the power line CON4 is connected to the constant current source 105B on the opposite end from the signal line 114.

The voltage VSFH is generated by a power source not illustrated and is applied to the power line CON5. The power line CON5 is connected to the signal line 111 through a second switch sw2.

The voltage VSFL is generated by a power source not illustrated and is applied to the power line CON6. The power line CON6 is connected to the signal line 111 through a third switch sw3.

The power source that generates the voltage AVDDP may be provided internally or externally with respect to the imaging apparatus 100. The same applies to the power source that generates the voltage VSFH and the power source that generates the voltage VSFL.

The constant current source 105B is connected to the signal line 111 through a fourth switch sw4. A ground potential AGND is applied to the constant current source 105B on the opposite end from the signal line 111.

Figure 2:
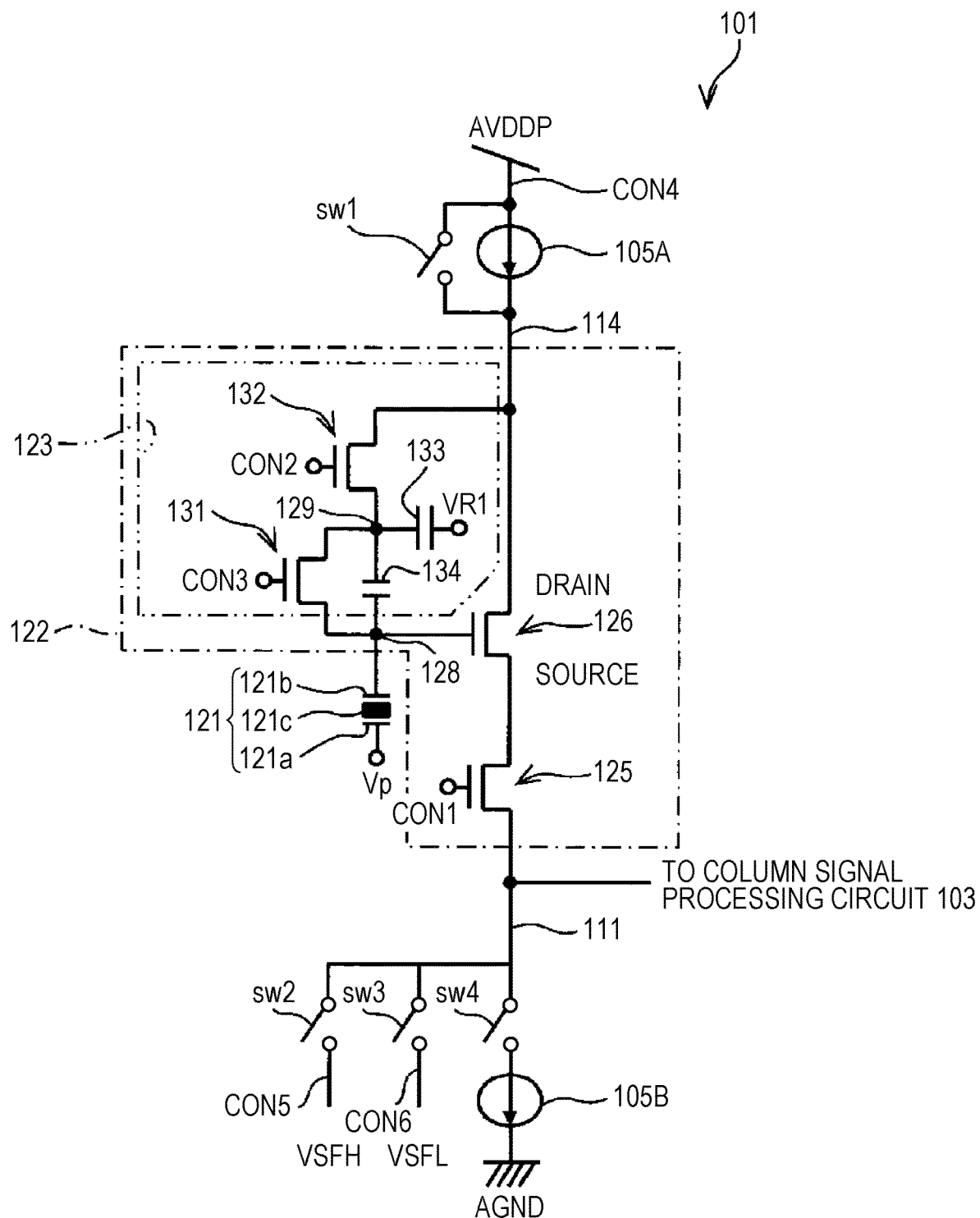
FIG. 2 is a circuit diagram illustrating a circuit configuration of a pixel.

FIG. 2 is a circuit diagram illustrating an exemplary configuration of one of the pixels 101 in the imaging apparatus 100 according to the present embodiment. The pixel 101 includes a photoelectric conversion unit 121 and a readout circuit 122.

The photoelectric conversion unit 121 is a photodetector. The photoelectric conversion unit 121 converts incident light, which acts as an optical signal, into a signal charge, which acts as an electrical signal. Hereinafter, the signal charge may be referred to simply as the charge.

The readout circuit 122 reads out an electrical signal detected by the photoelectric conversion unit 121. The readout circuit 122 includes a band control unit 123, a select transistor 125, and an amplification transistor 126. Also, the readout circuit 122 includes a charge storage node 128. Here, the charge storage node 128 refers to a configuration where signal charge that contributes to the output of the amplification transistor 126 is stored. Signal charge detected by the photoelectric conversion unit 121 is stored in the charge storage node 128.

In the present embodiment, the photoelectric conversion unit 121 includes a counter electrode 121a, a pixel electrode 121b, and a photoelectric conversion layer 121c.

A reference voltage Vp is applied to the counter electrode 121a. The pixel electrode 121b is included in the charge storage node 128. The photoelectric conversion layer 121c is disposed between the counter electrode 121a and the pixel electrode 121b.

Typically, the photoelectric conversion layer 121c is film-shaped. The photoelectric conversion layer 121c is formed by an organic material, for example.

The signal charge generated by the photoelectric conversion unit 121 is stored in the charge storage node 128. Specifically, the signal charge generated by the photoelectric conversion layer 121c is collected by the pixel electrode 121b. In this way, the signal charge is stored in the charge storage node 128.

More specifically, when light is incident on the photoelectric conversion layer 121c, electron-hole pairs are generated through photoelectric conversion. If there is a potential difference between the counter electrode 121a and the pixel electrode 121b, one of the generated electrons or holes will move to the pixel electrode 121b. In the present embodiment, the reference voltage Vp applied to the counter electrode 121a is higher than the voltage of the pixel electrode 121b. In this case, the holes move to the pixel electrode 121b. Accordingly, the holes are stored in the charge storage node 128.

In the present embodiment, the holes are used as the signal charge. However, the electrons may also be used as the signal charge.

In the imaging apparatus 100 according to the present embodiment, the photoelectric conversion unit 121 is stacked on the surface on one side of a semiconductor substrate 150. The imaging apparatus 100 may be considered to be a multilayer imaging apparatus.

Another element having a photoelectric conversion function may also be used as the photoelectric conversion unit. For example, it is also possible to use a photodiode as the photoelectric conversion unit. An example of using a photodiode as the photoelectric conversion unit will be described later with reference to FIGS. 17 and 18.

The charge storage node 128 includes the gate of the amplification transistor 126. The signal charge stored in the charge storage node 128 is outputted from the amplification transistor 126. Specifically, the amplification transistor 126 outputs a signal corresponding to the quantity of signal charge stored in the charge storage node 128 to the band control unit 123 and the select transistor 125.

The band control unit 123 includes a reset transistor 131, a feedback transistor 132, a capacitive element 133, and a capacitive element 134. The reset transistor 131 resets the charge storage node 128.

As described above, the signal charge stored in the charge storage node 128 is outputted from the amplification transistor 126. The feedback transistor 132 limits the band of the return signal that is outputted from the amplification transistor 126 and returned to the charge storage node 128.

A "capacitive element" means a structure in which a dielectric such as an insulating film is sandwiched between electrodes. Also, "electrodes" are not limited to electrodes formed from metal, and is interpreted to broadly include materials such as a polysilicon layer. The "electrodes" in this specification may also be a portion of the semiconductor substrate.

In a "noise suppression period" described later, the signal charge read out from the charge storage node 128 is amplified by the amplification transistor 126, band-limited by the feedback transistor 132, and then returned to the charge storage node 128. In other words, the readout circuit 122 includes a return pathway that provides a signal corresponding to the quantity of signal charge outputted from the amplification transistor 126 to the charge storage node 128 as negative feedback. The return pathway includes the amplification transistor 126, the feedback transistor 132, and the capacitive element 134.

The select transistor 125 determines the timing at which the amplification transistor 126 outputs an output signal. The select transistor 125 is connected to the signal line 111 shared by at least two of the pixels 101. In the present embodiment, the pixels 101 that share the signal line 111 belong to the same column. The signal line 111 does not have to be disposed in all columns. For example, a single signal line 111 may be disposed with respect to a plurality of columns, and the single signal line 111 may be shared by the plurality of columns. Alternatively, a plurality of signal lines 111 may be disposed with respect to a single column.

In a "readout period" and a "reset readout period" described later, the signal amplified by the amplification transistor 126 is outputted to the signal line 111 through the select transistor 125. In these periods, a return pathway is not formed.

In the present embodiment, the select transistor 125, the amplification transistor 126, the reset transistor 131, and the feedback transistor 132 are metal-oxide-semiconductor field-effect transistors (MOSFETs). The same also applies to a transfer transistor 137 described later with reference to FIGS. 17 and 18.

In the example illustrated in the drawings, the select transistor 125, the amplification transistor 126, the reset transistor 131, the feedback transistor 132, and the transfer transistor 137 are MOSFETs of the same conductivity type. Specifically, the select transistor 125, the amplification transistor 126, the reset transistor 131, the feedback transistor 132, and the transfer transistor 137 are n-type MOSFETs. However, the select transistor 125, the amplification transistor 126, the reset transistor 131, the feedback transistor 132, and the transfer transistor 137 may also be p-type MOSFETs.

Each of the select transistor 125, the amplification transistor 126, the reset transistor 131, and the feedback transistor 132 has a drain and a source. The source and the drain of each transistor are respective diffusion regions. The same applies to the transfer transistor 137.

In the present embodiment, which of the two diffusion regions is the source and which is the drain are fixed in the amplification transistor 126. In other words, in the amplification transistor 126, the source and the drain do not switch places. The same also applies to the select transistor 125.

On the other hand, which of the two diffusion regions is the source and which is the drain in the reset transistor 131 are determined according to the polarity of the reset transistor 131 and the level of potential at the time. Consequently, which is the source and which is the drain may vary depending on the operating state of the reset transistor 131. In other words, in the reset transistor 131, the source and the drain may switch places. The same also applies to the feedback transistor 132. The same also applies to the transfer transistor 137.

In a transistor in which the source and the drain do not switch places, the potential of the source and/or the drain may be fixed or may vary. In a transistor in which the source and the drain switch places, the potential of the source and/or the drain may be fixed or may vary.

In FIG. 2, for the amplification transistor 126, the upper diffusion region is the drain and the lower diffusion region is the source. For the select transistor 125, the upper diffusion region is the drain and the lower diffusion region is the source.

Figure 17:
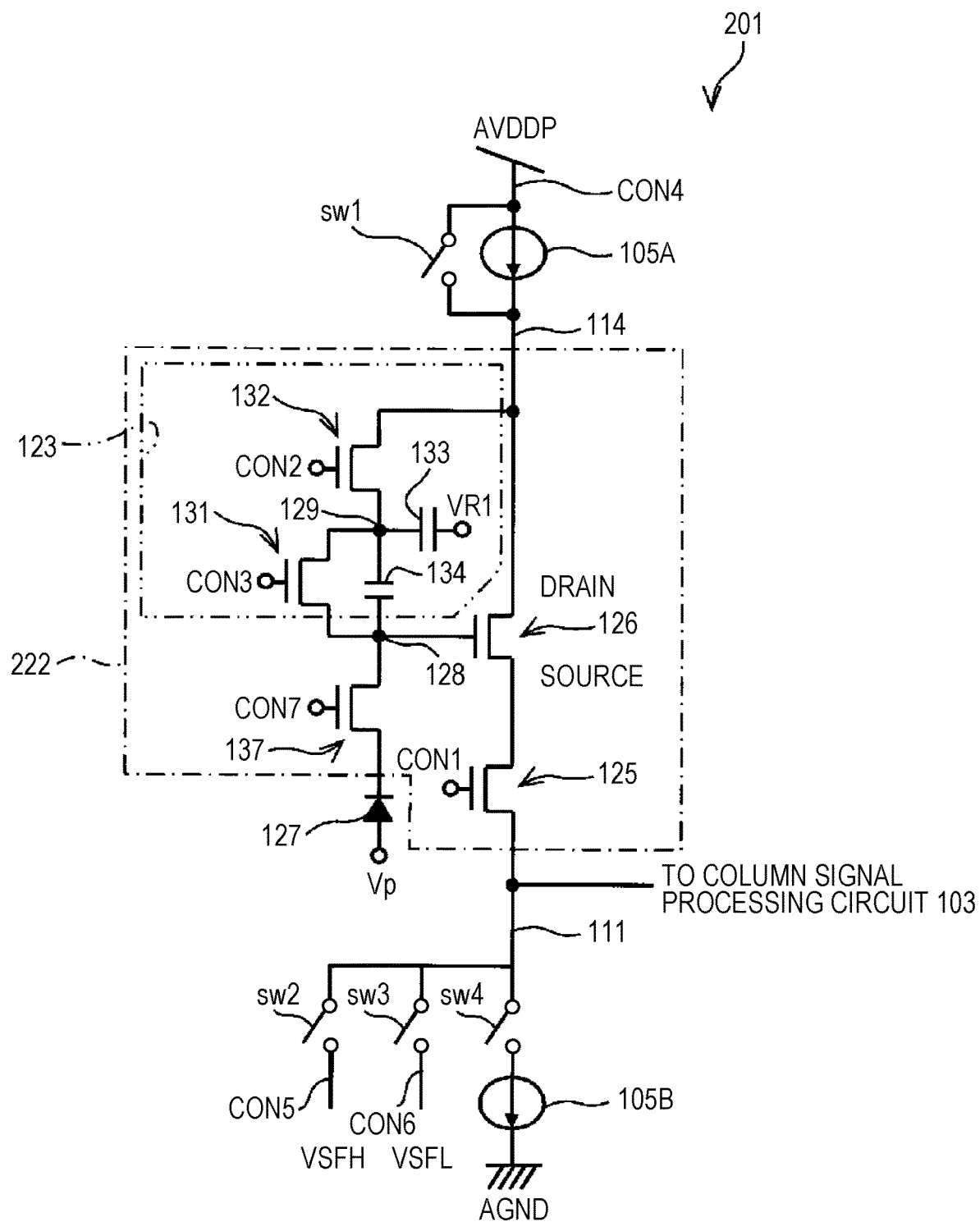
FIG. 17 is a circuit diagram illustrating a circuit configuration of a pixel.

In FIG. 2, for convenience, the lower diffusion region of the reset transistor 131 is designated as one of the drain or the source, and the upper diffusion region is designated as the other of the drain or the source. The lower diffusion region of the feedback transistor 132 is designated as one of the drain or the source, and the upper diffusion region is designated as the other of the drain or the source. In FIG. 17 described later, for convenience, the lower diffusion region of the transfer transistor 137 is designated as one of the drain or the source, and the upper diffusion region is designated as the other of the drain or the source.

<Operations by Readout Circuit 122>

Hereinafter, the operations by the readout circuit 122 in the example of FIG. 2 will be described.

The gate of the amplification transistor 126 is electrically connected to one of the drain or the source of the reset transistor 131. The drain of the amplification transistor 126 is connected to the other of the drain or the source of the feedback transistor 132. The source of the amplification transistor 126 is connected to the drain of the select transistor 125.

The constant current source 105A is connected to the drain of the amplification transistor 126. The power line CON4 may be connected to the drain of the amplification transistor 126.

In the example of FIG. 2, the drain of the amplification transistor 126 and the constant current source 105A are continuously electrically connected. However, the drain of the amplification transistor 126 and the constant current source 105A may also be connected through a switch.

The source of the select transistor 125 may be connected to the constant current source 105B. The source of the select transistor 125 may be connected to the power line CON5. The source of the select transistor 125 may be connected to the power line CON6.

One of the drain or the source of the feedback transistor 132 is electrically connected to one end of the capacitive element 133. A reference voltage VR1 is applied to the other end of the capacitive element 133. An RC filter circuit is formed by the feedback transistor 132 and the capacitive element 133.

One of the drain or the source of the feedback transistor 132 is electrically connected to one end of the capacitive element 134. The other end of the capacitive element 134 is electrically connected to one of the drain or the source of the reset transistor 131.

In the present embodiment, the capacitance Cs of the capacitive element 133 is greater than the capacitance Cc of the capacitive element 134.

The signal line CON2 is connected to the gate of the feedback transistor 132. The state of the feedback transistor 132 is determined by the voltage on the signal line CON2.

For example, when the voltage on the signal line CON2 is at the high level, the feedback transistor 132 turns on. As a result, a return pathway including the amplification transistor 126, the feedback transistor 132, and the capacitive element 134 in the above order is formed. With this arrangement, signal return from the charge storage node 128 to the charge storage node 128 is achieved.

If the voltage on the signal line CON2 is lowered, the resistance component of the feedback transistor 132 increases. Consequently, the cutoff frequency determined by the resistance component and the capacitance component on the return pathway is lowered, and the frequency range of the returning signal is narrowed.

When the return pathway is formed, the signal outputted by the feedback transistor 132 is attenuated by an attenuation circuit based on the capacitive element 134 and the parasitic capacitance of the charge storage node 128, and the attenuated signal is returned to the charge storage node 128.

If the voltage on the signal line CON2 falls even lower and reaches the low level, the feedback transistor 132 turns off. In this case, the return pathway is not formed.

The other of the drain or source of the reset transistor 131 is connected to a connection node 129. Here, the connection node means the electrical connecting portion between the plurality of elements in the electrical circuit, and is a concept that includes portions such as wiring that provides an electrical connection between the elements.

The signal line CON3 is connected to the gate of the reset transistor 131. The state of the reset transistor 131 is determined by the voltage on the signal line CON3. For example, when the voltage on the signal line CON3 is at the high level, the reset transistor 131 turns on. With this arrangement, the charge storage node 128 is reset to the voltage of the connection node 129.

The gate of the select transistor 125 is connected to the signal line CON1. The state of the select transistor 125 is determined by the voltage on the signal line CON1. For example, when the voltage on the signal line CON1 is at the high level, the select transistor 125 turns on. When the voltage on the signal line CON1 is at the low level, the select transistor 125 turns off.

Figure 3:
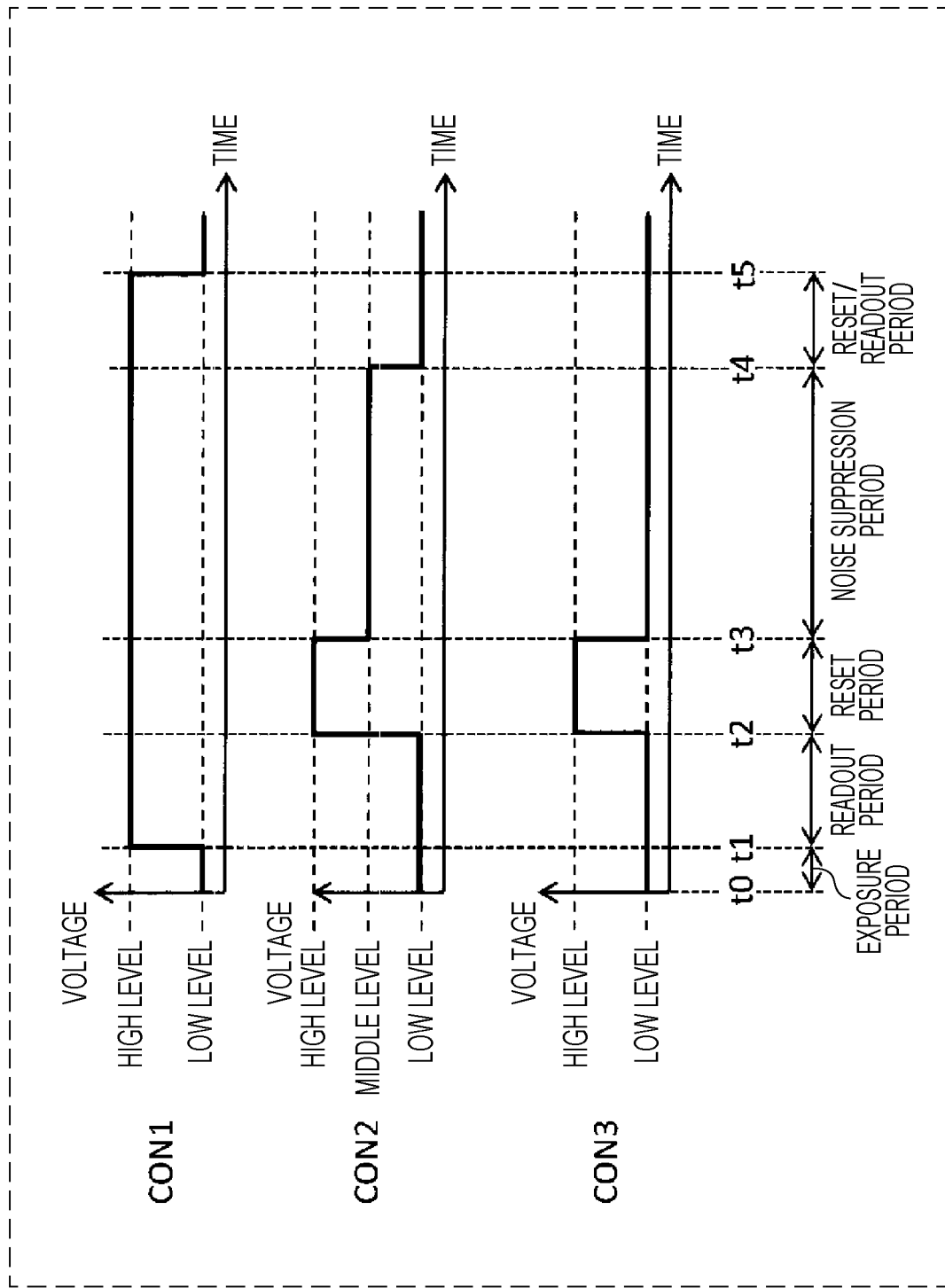
FIG. 3 is a timing chart for explaining operations by a readout circuit.

Next, the timing chart illustrated in FIG. 3 will be referenced to describe an example of operations by the readout circuit 122. In each of the graphs, the horizontal axis represents time. From the top, the vertical axis represents each of the voltage level of the signal line CON1, the voltage level of the signal line CON2, and the voltage level of the signal line CON3.

(Exposure Period)

The period from time t0 to time t1 corresponds to an exposure period.

In the period from time t0 to time t1, the voltage on the signal line CON1 is at the low level, and therefore the select transistor 125 is off. Also, in this period, a signal charge generated in response to incident light is stored in the charge storage node 128.

(Readout Period)

The period from time t1 to time t2 corresponds to a readout period.

At time t1, the voltage on the signal line CON1 goes to the high level, thereby turning on the select transistor 125. Also, in the readout period, the power line CON4 is electrically connected to the amplification transistor 126, and the constant current source 105B is electrically connected to the select transistor 125. In this state, the amplification transistor 126 and the constant current source 105B form a source follower circuit. Consequently, a signal corresponding to the signal charge stored in the charge storage node 128 is outputted to the signal line 111. At this time, the amplification ratio of the source follower circuit is approximately 1×, for example.

(Reset Period)

The period from time t2 to time t3 corresponds to a reset period.

At time t2, the voltage on the signal line CON2 goes to the high level, thereby turning on the feedback transistor 132. Also, in the reset period, the power line CON6 is connected to the select transistor 125, and the voltage VSFL is applied to the source of the amplification transistor 126. Furthermore, at time t2, the voltage on the signal line CON3 goes to the high level, thereby turning on the reset transistor 131. With this arrangement, the voltage of the charge storage node 128 is reset to the voltage VSFL.

(Noise Suppression Period)

The period from time t3 to time t4 corresponds to a noise suppression period.

At time t3, the voltage on the signal line CON3 goes to the low level, thereby turning off the reset transistor 131. At this time, the readout circuit 122 forms a return pathway with an amplification factor based on the state of the amplification transistor 126. This arrangement suppresses the kTC noise of the charge storage node 128 when the reset transistor 131 is turned off In the period from time t2 to time t3, the voltage on the signal line CON2 is set to the high-level voltage. On the other hand, in the period from time t3 to time t4, the voltage on the signal line CON2 is set to a middle-level voltage between the high level and the low level. For this reason, the operating band of the feedback transistor 132 is narrower in the period from time t3 to time t4 compared to the period from time t2 to time t3.

By narrowing the operating band of the feedback transistor 132, the noise suppression effect is enhanced. On the other hand, such narrowing increases the time required for noise suppression, and therefore necessitates a long time as the period from time t3 to time t4. The designer can freely adjust the operating band of the feedback transistor 132 according to the time that is allowable as the period from time t3 to time t4. Hereinafter, the operating band of the feedback transistor 132 in the noise suppression period will be treated as being sufficiently lower than the operating band of the amplification transistor 126. Note that a noise suppression effect is obtained not only in the case where the operating band of the feedback transistor 132 in the noise suppression period is lower than the operating band of the amplification transistor 126, but also in the case where the operating band of the feedback transistor 132 is higher.

(Reset Readout Period)

The period from time t4 to time t5 corresponds to a reset readout period.

At time t4, the power line CON4 is reconnected to the amplification transistor 126 and the constant current source 105B is reconnected to the select transistor 125. In this state, the amplification transistor 126 and the constant current source 105B form a source follower circuit. Consequently, a signal corresponding to the reset voltage is outputted to the signal line 111.

In the present embodiment, correlated double sampling is performed in a downstream circuit and the difference between the signal read out in the reset readout period and the signal read out in the readout period is calculated. Thereafter, the obtained difference is outputted externally from the imaging apparatus 100 as a pixel signal.

The kTC noise is included in random noise. Here, random noise refers to fluctuations in the output when the electrical signal converted by the photoelectric conversion unit 121 is 0. The kTC noise is suppressed in the noise suppression period. As a result, favorable image data with random noise suppressed can be acquired.

<Structure of Amplification Transistor 126>

Figure 4:
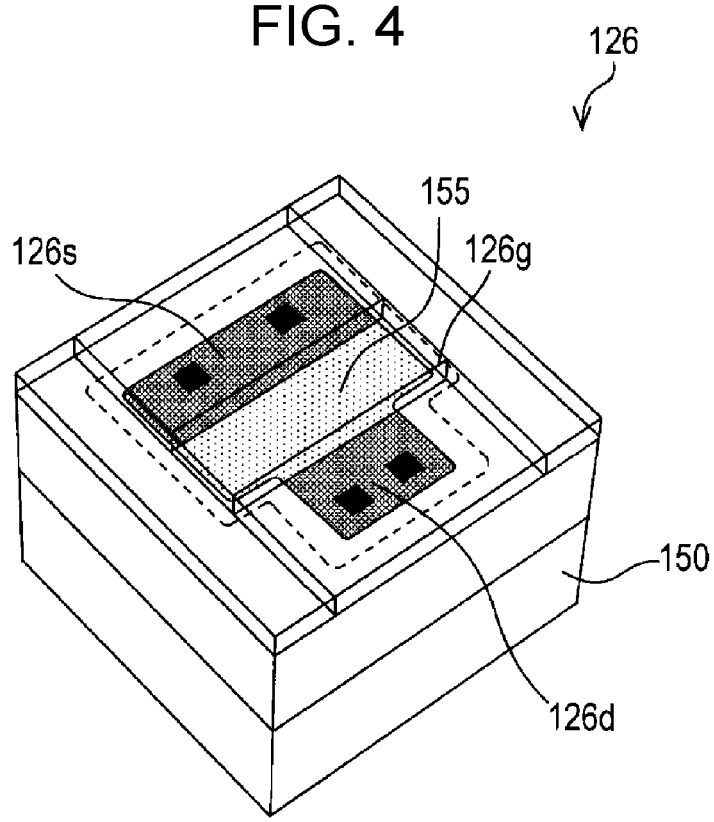
FIG. 4 is a perspective view illustrating the structure of an amplification transistor.
Figure 5:
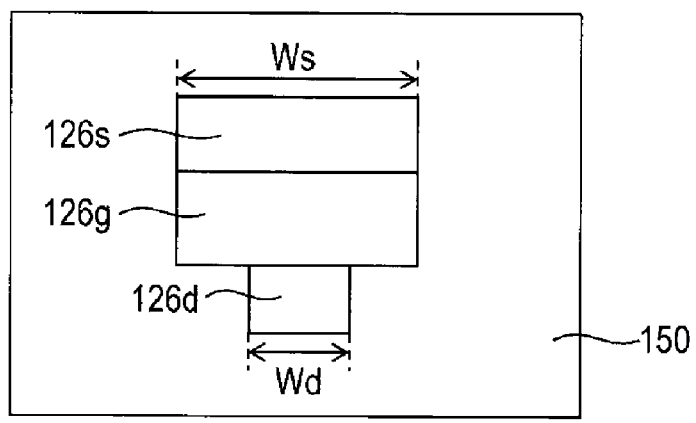
FIG. 5 is a plan view illustrating the structure of the amplification transistor.

FIG. 4 is a perspective view illustrating the structure of the amplification transistor 126. FIG. 5 is a plan view illustrating the structure of the amplification transistor 126.

FIG. 4 illustrates the source 126s of the amplification transistor 126, the drain 126d of the amplification transistor 126, the gate electrode 126g of the amplification transistor 126, and an implantation region 155. The implantation region 155 will be described later. Also, the dashed line is a contour line schematically illustrating the portion with a certain level of doping concentration.

As illustrated in FIG. 5, in the present embodiment, the width Wd of the drain 126d of the amplification transistor 126 is less than the width Ws of the source 126s of the amplification transistor 126 in a plan view. This is suitable for achieving a fast imaging apparatus 100 with low noise.

Specifically, reducing the width Wd of the drain 126d reduces the gate-drain capacitance Cgd of the amplification transistor 126, which is advantageous from the perspective of lowering noise. Increasing the width Ws of the source 126s reduces the parasitic resistance of the source 126s and increases the transconductance gm of the amplification transistor 126, which is advantageous from the perspective of speeding up the amplification transistor 126.

Note that reducing the parasitic resistance of the source 126s raises the gate-source voltage Vgs and also lowers the threshold voltage VTop due to a suppression of the substrate bias effect. These effects work in concert to raise the gate drive voltage Vdrive, and is advantageous from the perspective of securing the drain current Id of the amplification transistor 126. Increasing the transconductance gm and securing the drain current Id may also contribute to improved drive capability of the amplification transistor 126. Although it can be understood from the context, but just to be clear, in this description, the gate-source voltage Vgs is a value that accounts for factors such as the influence due to the parasitic resistance of the source 126s. In a typical example, the voltage Vgs is smaller than the difference between the gate voltage and the voltage outputted from a peripheral circuit to the source 126s due to the effects of parasitic resistance and the like. In a specific typical example, the voltage Vgs is smaller than the value expected from the control value set as the output voltage from a peripheral circuit to the source 126s due to the effects of parasitic resistance and the like. The gate drive voltage Vdrive is the difference between the gate-source voltage Vgs and the threshold voltage VTop, and is given by Vdrive=Vgs−VTop. The substrate bias effect, also referred to as the back bias effect, is a value based on the back bias voltage Vb of the semiconductor substrate 150.

Here, a "plan view" refers to a view in a direction perpendicular to the surface of the semiconductor substrate 150. A "plan view" may also be considered to be a view in the thickness direction of the semiconductor substrate 150. FIG. 5 illustrates the amplification transistor 126 in a plan view.

The edges of the diffusion region such as the source and drain are prescribed by the junction, that is, the portion where the concentration of n-type impurities and the concentration of p-type impurities are equal. The junction may also be referred to as the p-n junction.

The width Ws of the source 126s and the width Wd of the drain 126d of the amplification transistor 126 will be described in detail.

If a voltage is applied to the gate electrode 126g of the amplification transistor 126 to turn on the amplification transistor 126, a channel is formed between the source 126s and the drain 126d. The channel is a pathway for current. In a plan view, the channel has a prescribed channel width, that is, the dimension in the direction orthogonal to the direction of current flow.

According to a first definition, the width Ws of the source 126s is the width, in a plan view, of the portion of the source 126s adjacent to the channel when the amplification transistor 126 is turned on. The width Wd of the drain 126d is the width, in a plan view, of the portion of the drain 126d adjacent to the channel when the amplification transistor 126 is turned on.

Also, in the first definition, the direction prescribing the width Ws of the source 126s in a plan view is the direction prescribing the channel width of the channel at a position adjacent to the source 126s in a plan view when the amplification transistor 126 is turned on. The direction prescribing the width Wd of the drain 126d in a plan view is the direction prescribing the channel width of the channel at a position adjacent to the drain 126d in a plan view when the amplification transistor 126 is turned on.

According to a second definition, the width Ws of the source 126s of the amplification transistor 126 is the dimension, in a plan view, of the portion of the source 126s adjacent to the outline of the gate electrode 126g of the amplification transistor 126. The width Wd of the drain 126d of the amplification transistor 126 is the dimension, in a plan view, of the portion of the drain 126d adjacent to the outline of the gate electrode 126g of the amplification transistor 126.

In the present embodiment, if a descriptive statement regarding the width Ws and/or the width Wd holds true on the basis of at least one of the first definition or the second definition, the descriptive statement is treated as holding true. For example, if it may be said that Wd<Ws holds true on the basis of at least one of the first definition or the second definition, Wd<Ws is treated as holding true.

Figure 6:
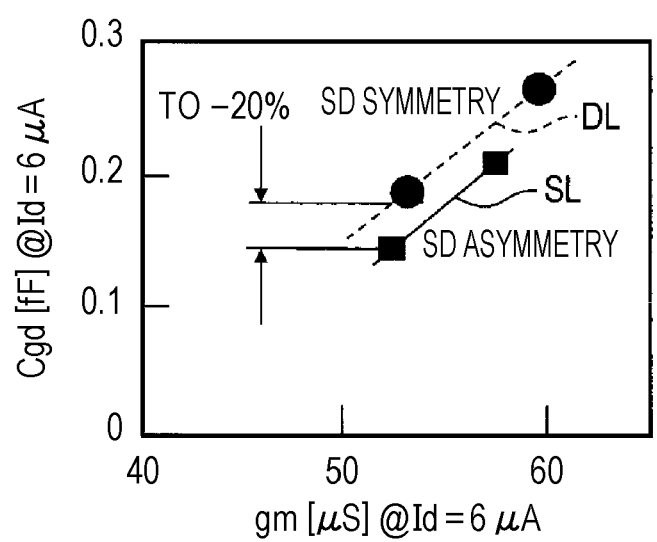
FIG. 6 is a graph showing the relationship, obtained by simulation, between the transconductance gm of the amplification transistor and the gate-drain capacitance Cgd of the amplification transistor.

FIG. 6 illustrates a simulation result expressing the result when Wd<Ws. In FIG. 6, the horizontal axis is the transconductance gm (units: μS) of the amplification transistor. The vertical axis is the gate-drain capacitance Cgd (units: fF) of the amplification transistor. In the simulation, the drain current Id of the amplification transistor is set to 6 μA.

The simulation uses an SD symmetry model including an amplification transistor and an SD asymmetry model including an amplification transistor. In the amplification transistor of the SD symmetry model, Wd=Ws. In the amplification transistor of the SD asymmetry model, Wd<Ws. The amplification transistor of the SD asymmetry model corresponds to the amplification transistor 126 of the present embodiment.

In FIG. 6, the dashed line DL indicates the relationship between gm and Cgd in the case of using the SD symmetry model. The solid line SL indicates the relationship between gm and Cgd in the case of using the SD asymmetry model. A comparison of the dashed DL to the solid SL reveals that, compared to the SD symmetry model, the SD asymmetry model has an advantage in that Cgd is decreased while gm is increased. Quantitatively, the simulation results indicate that according to the SD asymmetry model, Cgd can be reduced by approximately 20% for the same gm compared to the SD symmetry model.

The ratio Wd/Ws of the width Wd of the drain 126d of the amplification transistor 126 with respect to the width Ws of the source 126s of the amplification transistor 126 is 0.9 or less, for example. The ratio Wd/Ws may also be 0.8 or less, and may also be 0.7 or less. The ratio Wd/Ws is 0.1 or greater, for example. The ratio Wd/Ws may also be 0.2 or greater, and may also be 0.3 or greater.

In the example of FIGS. 4 and 5, the source 126s of the amplification transistor 126 is formed by a single contiguous diffusion region. In other words, the source 126s of the amplification transistor 126 has an undivided structure. Also, the drain 126d of the amplification transistor 126 is formed by a single contiguous diffusion region. In other words, the drain 126d of the amplification transistor 126 has an undivided structure.

Figure 7:
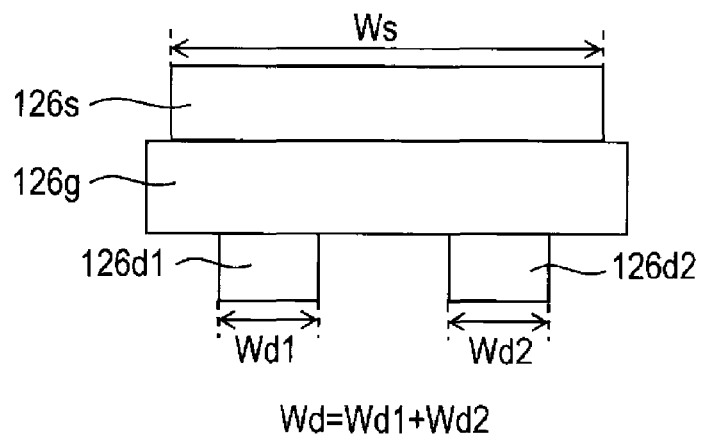
FIG. 7 is an explanatory diagram of an amplification transistor with a split structure.
Figure 8:
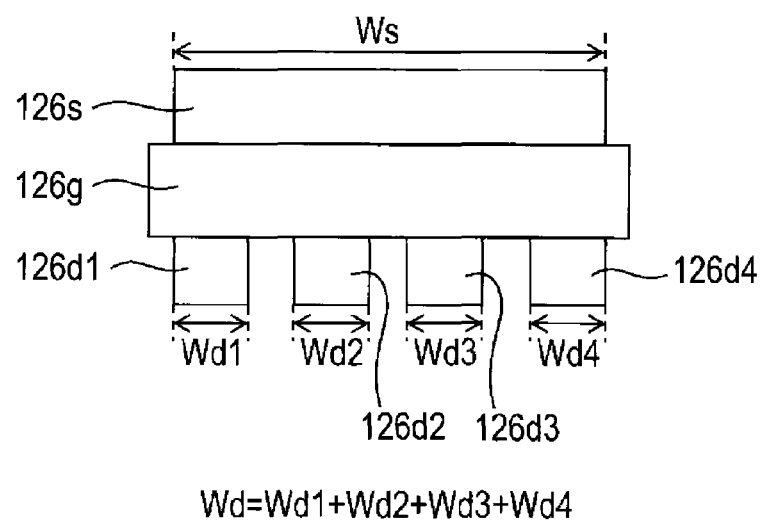
FIG. 8 is an explanatory diagram of an amplification transistor with a split structure.

The examples in FIGS. 7 and 8 may also be adopted. In the examples in FIGS. 7 and 8, the drain 126d of the amplification transistor 126 is formed by a plurality of diffusion regions. In other words, the drain 126d of the amplification transistor 126 has a divided structure divided into a plurality of diffusion regions. In a plan view, the width Wd of the drain 126d having a divided structure is given as the combined value of the widths of the plurality of diffusion regions forming the drain 126d.

Specifically, in the example of FIG. 7, the drain 126d of the amplification transistor 126 is formed by two diffusion regions, namely a first diffusion region 126d1 and a second diffusion region 126d2. In other words, the drain 126d of the amplification transistor 126 has a divided structure divided into two diffusion regions. In a plan view, the width Wd of the drain 126d is the combined value of the width Wd1 of the first diffusion region 126d1 and the width Wd2 of the second diffusion region 126d2. In other words, Wd=Wd1±Wd2.

In the example of FIG. 8, the drain 126d of the amplification transistor 126 is formed by four diffusion regions, namely a first diffusion region 126d1, a second diffusion region 126d2, a third diffusion region 126d3, and a fourth diffusion region 126d4. In other words, the drain 126d of the amplification transistor 126 has a divided structure divided into four diffusion regions. In a plan view, the width Wd of the drain 126d is the combined value of the width Wd1 of the first diffusion region 126d1, the width Wd2 of the second diffusion region 126d2, the width Wd3 of the third diffusion region 126d3, and the width Wd4 of the fourth diffusion region 126d4. In other words, Wd=Wd1+Wd2+Wd3+Wd4.

In the drain 126d having a divided structure, the number of divisions is not particularly limited. In other words, the number of diffusion regions that form the drain 126d is not particularly limited. In the examples of FIGS. 7 and 8, there are an even number of divisions. However, the number of divisions may also be an odd number.

Like the amplification transistor 126, a divided structure of the source and/or the drain may also be adopted for the select transistor 125, the reset transistor 131, and the feedback transistor 132 (as well as the transfer transistor 137 described later). The description regarding the divided structure of the drain 126d of the amplification transistor 126 may be cited in the description regarding the divided structure of the above transistors, as long as there is no contradiction.

As is understood from the above description, in the present embodiment, the output signal of the amplification transistor 126 is provided to the charge storage node 128 as negative feedback. In the case where such negative feedback is provided, the magnitude relationship of Wd<Ws may achieve highly efficient noise canceling. Specifically, in the present embodiment, the output signal of the amplification transistor 126 is provided as negative feedback to the charge storage node 128 through the feedback transistor 132.

Hereinafter, the noise canceling achieved through negative feedback will be described further while also describing the charge storage node 128.

As described above, the charge storage node 128 refers to a configuration where signal charge that contributes to the output of the amplification transistor 126 is stored. In the present embodiment, the pixel electrode 121b of the photoelectric conversion unit 121 is a portion of the charge storage node 128. A charge storage unit 124 is a portion of the charge storage node 128. The wiring connecting the pixel electrode 121b and the charge storage unit 124 is a portion of the charge storage node 128. The gate electrode 126g of the amplification transistor 126 is a portion of the charge storage node 128. Note that the charge storage unit 124 is a diffusion region. The charge storage unit 124 will be described in detail later.

The signal charge stored in the charge storage node 128 is reset to a reference level by the reset transistor 131. Immediately after the reset, reset noise gets mixed into the signal charge. The mixed-in noise may be canceled by the above negative feedback. The signal charge is read out by the amplification transistor 126.

The parasitic capacitance of the charge storage node 128 is an adverse influence on the negative feedback, and may degrade the reset noise canceling effect. The parasitic capacitance of the charge storage node 128 includes the gate-drain capacitance Cgd of the amplification transistor 126. In other words, the gate-drain capacitance Cgd acts as the parasitic capacitance of the charge storage node 128.

However, as described above, reducing the width Wd of the drain 126d makes it easy to lower the capacitance Cgd. This arrangement may lower the parasitic capacitance of the charge storage node 128 and improve the noise canceling effect achieved through negative feedback. By improving the noise canceling effect, dark current can be suppressed.

Note that lowering the capacitance of the charge storage node 128 is also advantageous in that the conversion gain by which the signal charge is converted into a voltage by the amplification transistor 126 may be improved.

In the present embodiment, the imaging apparatus 100 is configured such that the ratio Rd of the change in the potential of the drain 126d with respect to the change in the potential of the gate electrode 126g is small compared to the ratio Rs of the change in the potential of the source 126s with respect to the change in the potential of the gate electrode 126g. Consequently, the "apparent" gate-drain capacitance of the amplification transistor 126 is large compared to the "apparent" gate-source capacitance of the amplification transistor 126. In this case, reducing the width Wd of the drain 126d is effective at improving the noise canceling effect.

The ratio Rd is 0% or greater and 30% or less, for example. The ratio Rd may also be 0% or greater and 20% or less. The ratio Rs is 70% or greater and 100% or less, for example. The ratio Rs may also be 80% or greater and 100% or less.

Specifically, in the amplification transistor 126 of the present embodiment, the degree of floating by the source 126s is large compared to the degree of floating by the drain 126d. Consequently, the potential of the source 126s is more susceptible to the influence of the change in the potential of the gate electrode 126g compared to the potential of the drain 126d. This is the reason why Rs>Rd.

In one specific example, the potential of the drain 126d of the amplification transistor 126 is a direct-current (DC) potential. Here, the DC potential may be a potential that is always fixed or a potential having a first level in a certain period and a second level in a different period. The first level and the second level are different from each other. On the other hand, the potential of the source 126s of the amplification transistor 126 floats (in other words, is a floating potential), and changes by a non-zero ratio according to a change in the potential of the gate electrode 126g of the amplification transistor 126.

Note that the imaging apparatus 100 may also have a mode in which the degree of floating by the drain 126d of the amplification transistor 126 is relatively small and a mode in which the degree of floating by the drain 126d is relatively large. In the latter mode, the degree of floating by the drain 126d may be comparable to the degree of floating by the source 126s.

In the present embodiment, the pixel electrode 121b of the photoelectric conversion unit 121 is a metal. In this case, complete transfer from the photoelectric conversion unit to the charge storage unit like what may be achieved with an imaging apparatus using a photodiode as the photoelectric conversion unit is difficult. Consequently, favorably reducing the reset noise is not easy even if a transfer transistor is combined with the present embodiment. For this reason, in the case where the pixel electrode 121b is a metal, it is particularly valuable to be able to perform highly efficient noise canceling based on negative feedback according to the magnitude relationship of Wd<Ws.

Note that the pixel electrode 121b may also be a non-metal such as a semiconductor material. Also, in the present embodiment, the pixel 101 does not include a transfer transistor, but a transfer transistor may also be included.

Hereinafter, the present embodiment will be described further while also describing the charge storage unit 124.

Signal charge detected by the photoelectric conversion unit 121 is stored in the charge storage unit 124. The charge storage unit 124 is a diffusion region. Specifically, the charge storage unit 124 is provided in the semiconductor substrate 150.

The pixel electrode 121b is electrically connected to the charge storage unit 124.

The signal charge generated by the photoelectric conversion unit 121 is stored in the charge storage unit 124. Specifically, the signal charge generated by the photoelectric conversion layer 121c is collected by the pixel electrode 121b and then stored in the charge storage unit 124.

In the present embodiment, the reference voltage Vp applied to the counter electrode 121a is higher than the voltage of the pixel electrode 121b. Consequently, holes move to the pixel electrode 121b and then move to the charge storage unit 124 through wiring.

The charge storage unit 124 is electrically connected to the gate of the amplification transistor 126. The amplification transistor 126 outputs a signal corresponding to the quantity of signal charge stored in the charge storage unit 124 to the band control unit 123 and the select transistor 125.

The reset transistor 131 resets the charge storage unit 124. The feedback transistor 132 limits the charge of the return signal returned from the charge storage unit 124 through the amplification transistor 126.

In the "noise suppression period" described above, the signal charge read out from the charge storage unit 124 is amplified by the amplification transistor 126, band-limited by the feedback transistor 132, and then returned to the charge storage unit 124. In other words, the readout circuit 122 includes a return pathway that provides a signal corresponding to the quantity of signal charge outputted from the amplification transistor 126 to the charge storage unit 124 as negative feedback. The return pathway includes the charge storage unit 124, the amplification transistor 126, the feedback transistor 132, and the capacitive element 134.

For example, when the voltage on the signal line CON2 is at the high level, the feedback transistor 132 turns on. As a result, a return pathway including the charge storage unit 124, the amplification transistor 126, the feedback transistor 132, and the capacitive element 134 in the above order is formed.

In the present embodiment, one of the drain or the source of the reset transistor 131 is the charge storage unit 124. However, the charge storage unit 124 may also be another diffusion region electrically connected to one of the drain or the source of the reset transistor 131.

In the present embodiment, when the voltage on the signal line CON3 is at the high level, the reset transistor 131 turns on. With this arrangement, the charge storage unit 124 is reset to the voltage of the connection node 129.

<Transistor Arrangement Example>

Figure 9:
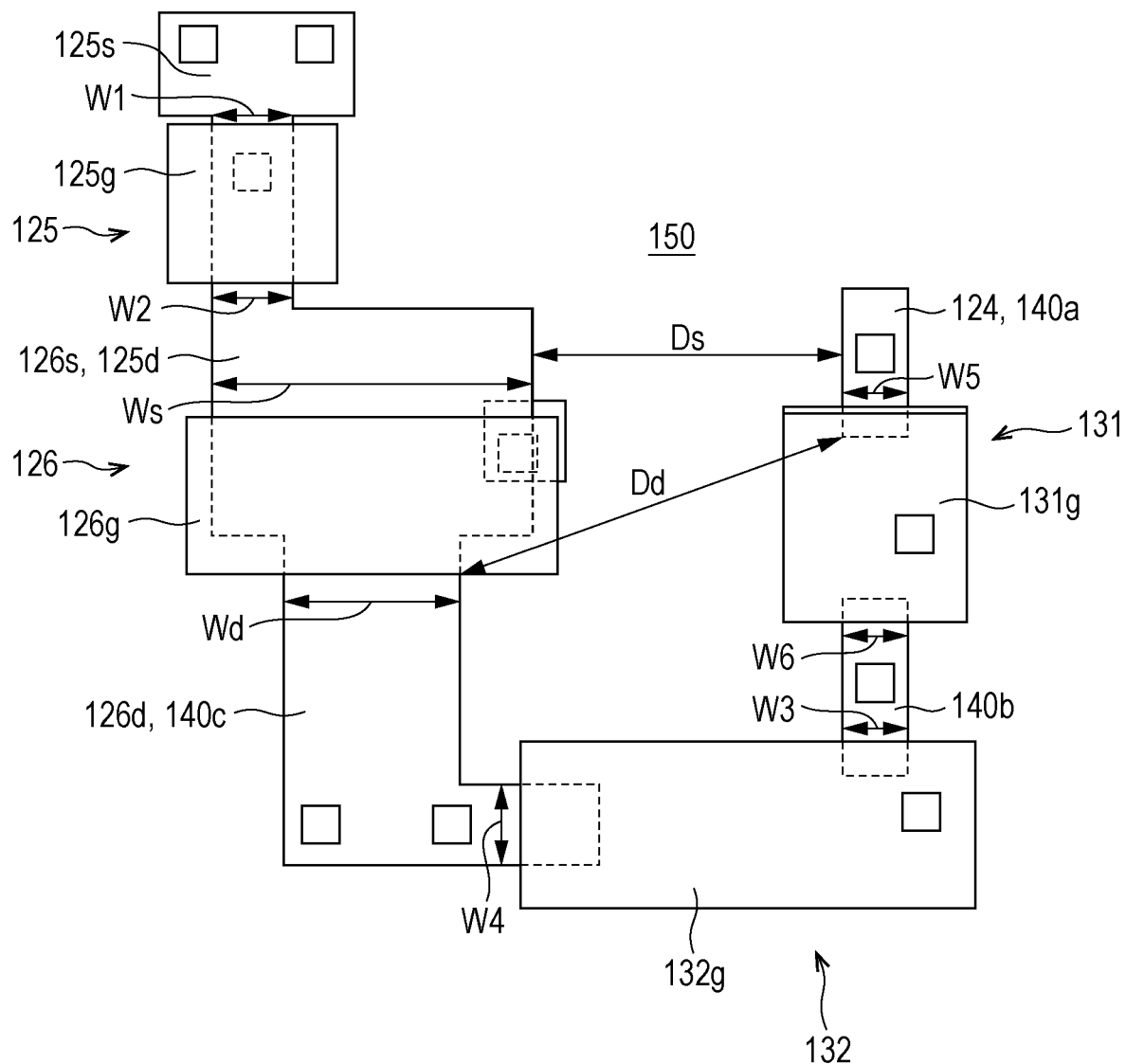
FIG. 9 is a plan view illustrating the arrangement of transistors.

FIG. 9 is a plan view illustrating the arrangement of the select transistor 125, the amplification transistor 126, the reset transistor 131, and the feedback transistor 132.

As FIG. 9 demonstrates, according to the present embodiment, in a plan view, the distance Dd from the drain 126d of the amplification transistor 126 to the charge storage unit 124 is greater than the distance Ds from the source 126s of the amplification transistor 126 to the charge storage unit 124. This is suitable for achieving an imaging apparatus 100 with low noise.

Specifically, capacitive coupling may occur between the charge storage node 128 and the wiring connected to the drain 126d of the amplification transistor 126. However, the capacitive coupling can be suppressed by increasing the distance Dd from the drain 126d of the amplification transistor 126 to the charge storage unit 124. This is advantageous from the perspective of achieving an imaging apparatus 100 with low noise.

In one example, the distance Dd is the minimum interval, in a plan view, between the drain 126d of the amplification transistor 126 and the charge storage unit 124. The distance Ds is the minimum interval, in a plan view, between the source 126s of the amplification transistor 126 and the charge storage unit 124. In FIG. 9, the distances Dd and Ds based on the above example are indicated by arrows.

The ratio Dd/Ds of the distance Dd with respect to the distance Ds is 1.1 or greater, for example. The ratio Dd/Ds may also be 1.5 or greater, and may also be 2 or greater. The ratio Dd/Ds is 10 or less, for example. The ratio Dd/Ds may also be 8 or less, and may also be 5 or less.

In the present embodiment, the feedback transistor 132 includes a first diffusion region 140b that operates as one of the source or the drain, and a second diffusion region 140c that operates as the other of the source or the drain. In a plan view, the width W3 of the first diffusion region 140b of the feedback transistor 132 is smaller than the width Wd of the drain 126d of the amplification transistor 126. In a plan view, the width W4 of the second diffusion region 140c of the feedback transistor 132 is smaller than the width Wd of the drain 126d of the amplification transistor 126. In the present embodiment, both of the above magnitude relationships hold true, but it is also possible for only one to hold true.

The width W3 of the first diffusion region 140b and the width W4 of the second diffusion region 140c of the feedback transistor 132 will be described in detail.

If a voltage is applied to the gate electrode 132g of the feedback transistor 132 to turn on the feedback transistor 132, a channel is formed between the first diffusion region 140b and the second diffusion region 140c. The channel is a pathway for current. In a plan view, the channel has a prescribed channel width, that is, the dimension in the direction orthogonal to the direction of current flow.

According to a first definition, the width W3 of the first diffusion region 140b of the feedback transistor 132 is the width, in a plan view, of the portion of the first diffusion region 140b adjacent to the channel when the feedback transistor 132 is turned on. The width W4 of the second diffusion region 140c of the feedback transistor 132 is the width, in a plan view, of the portion of the second diffusion region 140c adjacent to the channel when the feedback transistor 132 is turned on.

Also, in the first definition, the direction prescribing the width W3 of the first diffusion region 140b in a plan view is the direction prescribing the channel width of the channel at a position adjacent to the first diffusion region 140b in a plan view when the feedback transistor 132 is turned on. The direction prescribing the width W4 of the second diffusion region 140c in a plan view is the direction prescribing the channel width of the channel at a position adjacent to the second diffusion region 140c in a plan view when the feedback transistor 132 is turned on.

According to a second definition, the width W3 of the first diffusion region 140b of the feedback transistor 132 is the width, in a plan view, of the portion of the first diffusion region 140b adjacent to the outline of the gate electrode 132g of the feedback transistor 132. The width W4 of the second diffusion region 140c of the feedback transistor 132 is the width, in a plan view, of the portion of the second diffusion region 140c adjacent to the outline of the gate electrode 132g of the feedback transistor 132.

In the present embodiment, if a descriptive statement regarding the width W3 and/or the width W4 holds true on the basis of at least one of the first definition or the second definition, the descriptive statement is treated as holding true. For example, if it may be said that W3<Wd holds true on the basis of at least one of the first definition or the second definition, W3<Wd is treated as holding true. Also, if it may be said that W4<Wd holds true on the basis of at least one of the first definition or the second definition, W4<Wd is treated as holding true.

The ratio W3/Wd of the width W3 of the first diffusion region 140b of the feedback transistor 132 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

The ratio W4/Wd of the width W4 of the second diffusion region 140c of the feedback transistor 132 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

In the present embodiment, the diffusion region 140c is also the drain 126d of the amplification transistor 126. Stated differently, the diffusion region is shared by the amplification transistor 126 and the feedback transistor 132.

In the present embodiment, the width W1 of the source 125s of the select transistor 125 is less than the width Wd of the drain 126d of the amplification transistor 126 in a plan view. The width W2 of the drain 125d of the select transistor 125 is less than the width Wd of the drain 126d of the amplification transistor 126 in a plan view. In the present embodiment, both of the above magnitude relationships hold true, but it is also possible for only one to hold true.

A gate voltage is applied to the gate electrode 125g of the select transistor 125. By switching the gate voltage between a high level and a low level, the select transistor 125 can be switched on and off. When switching the gate voltage, capacitive coupling occurs between the gate and the source due to the gate-source capacitance of the select transistor 125. Also, when switching the gate voltage, capacitive coupling occurs between the gate and the drain due to the gate-drain capacitance of the select transistor 125.

However, the gate-source capacitive coupling can be suppressed by reducing the width W1 of the source 125s of the select transistor 125. Furthermore, the gate-drain capacitive coupling can be suppressed by reducing the width W2 of the drain 125d of the select transistor 125.

Note that the select transistor 125 is used as a switch. For this reason, there are few drawbacks even if the transconductance is lowered as a result of reducing the width W1 of the source 125s and/or the width W2 of the drain 125d of the select transistor 125.

The width W1 of the source 125s and the width W2 of the drain 125d of the select transistor 125 will be described in detail.

If a voltage is applied to the gate electrode 125g of the select transistor 125 to turn on the select transistor 125, a channel is formed between the source 125s and the drain 125d. The channel is a pathway for current. In a plan view, the channel has a prescribed channel width, that is, the dimension in the direction orthogonal to the direction of current flow.

According to a first definition, the width W1 of the source 125s is the width, in a plan view, of the portion of the source 125s adjacent to the channel when the select transistor 125 is turned on. The width W2 of the drain 125d is the width, in a plan view, of the portion of the drain 125d adjacent to the channel when the select transistor 125 is turned on.

Also, in the first definition, the direction prescribing the width W1 of the source 125s in a plan view is the direction prescribing the channel width of the channel at a position adjacent to the source 125s in a plan view when the select transistor 125 is turned on. The direction prescribing the width W2 of the drain 125d in a plan view is the direction prescribing the channel width of the channel at a position adjacent to the drain 125d in a plan view when the select transistor 125 is turned on.

According to a second definition, the width W1 of the source 125s of the select transistor 125 is the dimension, in a plan view, of the portion of the source 125s adjacent to the outline of the gate electrode 125g of the select transistor 125. The width W2 of the drain 125d of the select transistor 125 is the dimension, in a plan view, of the portion of the drain 125d adjacent to the outline of the gate electrode 125g of the select transistor 125.

In the present embodiment, if a descriptive statement regarding the width W1 and/or the width W2 holds true on the basis of at least one of the first definition or the second definition, the descriptive statement is treated as holding true. For example, if it may be said that W1<Wd holds true on the basis of at least one of the first definition or the second definition, W1<Wd is treated as holding true. Also, if it may be said that W2<Wd holds true on the basis of at least one of the first definition or the second definition, W2<Wd is treated as holding true.

The ratio W1/Wd of the width W1 of the source 125s of the select transistor 125 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

The ratio W2/Wd of the width W2 of the drain 125d of the select transistor 125 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

In the present embodiment, the diffusion region forming the drain 125d of the select transistor 125 is the same as the diffusion region forming the source 126s of the amplification transistor 126. Stated differently, the diffusion region is shared by the select transistor 125 and the amplification transistor 126.

In the present embodiment, the reset transistor 131 includes a first diffusion region 140a that operates as one of the source or the drain, and a second diffusion region 140b that operates as the other of the source or the drain. In a plan view, the width W5 of the first diffusion region 140a of the reset transistor 131 is smaller than the width Wd of the drain 126d of the amplification transistor 126. In a plan view, the width W6 of the second diffusion region 140b of the reset transistor 131 is smaller than the width Wd of the drain 126d of the amplification transistor 126. In the present embodiment, both of the above magnitude relationships hold true, but it is also possible for only one to hold true. In this context, the source of the reset transistor 131 may be the charge storage unit 124. The drain of the reset transistor 131 may be the charge storage unit 124. Additionally, another diffusion region that is not the source or the drain of the reset transistor 131 may also be the charge storage unit 124.

The width W5 of the first diffusion region 140a and the width W6 of the second diffusion region 140b of the reset transistor 131 will be described in detail.

If a voltage is applied to the gate electrode 131g of the reset transistor 131 to turn on the reset transistor 131, a channel is formed between the first diffusion region 140a and the second diffusion region 140b. The channel is a pathway for current. In a plan view, the channel has a prescribed channel width, that is, the dimension in the direction orthogonal to the direction of current flow.

According to a first definition, the width W5 of the first diffusion region 140a of the reset transistor 131 is the width, in a plan view, of the portion of the first diffusion region 140a adjacent to the channel when the reset transistor 131 is turned on. The width W6 of the second diffusion region 140b of the reset transistor 131 is the width, in a plan view, of the portion of the second diffusion region 140b adjacent to the channel when the reset transistor 131 is turned on.

Also, in the first definition, the direction prescribing the width W5 of the first diffusion region 140a in a plan view is the direction prescribing the channel width of the channel at a position adjacent to the first diffusion region 140a in a plan view when the reset transistor 131 is turned on. The direction prescribing the width W6 of the second diffusion region 140b in a plan view is the direction prescribing the channel width of the channel at a position adjacent to the second diffusion region 140b in a plan view when the reset transistor 131 is turned on.

According to a second definition, the width W5 of the first diffusion region 140a of the reset transistor 131 is the width, in a plan view, of the portion of the first diffusion region 140a adjacent to the outline of the gate electrode 131g of the reset transistor 131. The width W6 of the second diffusion region 140b of the reset transistor 131 is the width, in a plan view, of the portion of the second diffusion region 140b adjacent to the outline of the gate electrode 131g of the reset transistor 131.

In the present embodiment, if a descriptive statement regarding the width W5 and/or the width W6 holds true on the basis of at least one of the first definition or the second definition, the descriptive statement is treated as holding true. For example, if it may be said that W5<Wd holds true on the basis of at least one of the first definition or the second definition, W5<Wd is treated as holding true. Also, if it may be said that W6<Wd holds true on the basis of at least one of the first definition or the second definition, W6<Wd is treated as holding true.

The ratio W5/Wd of the width W5 of the first diffusion region 140a of the reset transistor 131 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

The ratio W6/Wd of the width W6 of the second diffusion region 140b of the reset transistor 131 with respect to the width Wd of the drain 126d of the amplification transistor 126 is 0.9 or less, for example. The ratio may also be 0.8 or less, and may also be 0.7 or less. The ratio is 0.1 or greater, for example. The ratio may also be 0.2 or greater, and may also be 0.3 or greater.

As FIG. 9 demonstrates, in the present embodiment, the diffusion region 140b is shared by the reset transistor 131 and the feedback transistor 132.

In the example of FIG. 9, the gate 131g of the reset transistor 131 partially overlaps with the diffusion region 140a (that is, with the charge storage unit 124) in a plan view. The gate 131g partially overlaps with the diffusion region 140b in a plan view. Also, the gate 132g of the feedback transistor 132 partially overlaps with the diffusion region 140b in a plan view.

On the other hand, the gate 132g of the feedback transistor 132 does not overlap with the diffusion region 140c in a plan view. The gate 126g of the amplification transistor 126 does not overlap with the drain 126d (that is, with the diffusion region 140c) in a plan view. The gate 126g of the amplification transistor 126 does not overlap with the drain 126d in a plan view. The gate 126g does not overlap with the source 126s. The gate 125g of the select transistor 125 does not overlap with the drain 125d (that is, with the source 126s) in a plan view. The gate 125g does not overlap with the source 125s in a plan view.

However, in the reset transistor 131, the gate 131g may or may not partially overlap with each of the two diffusion regions 140a and 140b. The same also applies to the select transistor 125, the amplification transistor 126, the feedback transistor 132, and the transfer transistor 137.

Figure 10A:
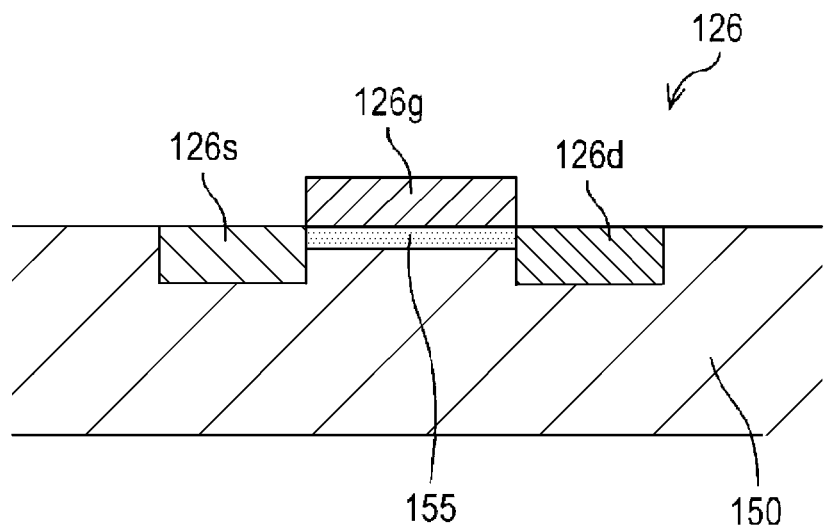
FIG. 10A is a cross section of the amplification transistor.

FIG. 10A illustrates a cross section of the amplification transistor 126 according to the present embodiment. As FIG. 10A demonstrates, the amplification transistor 126 is a depletion-mode transistor. Specifically, the amplification transistor 126 is a depletion-mode MOSFET. The same also applies to the select transistor 125. Configuring a transistor in depletion mode lowers the threshold voltage of the transistor, which is advantageous from the perspective of raising the operating efficiency.

Figure 10B:
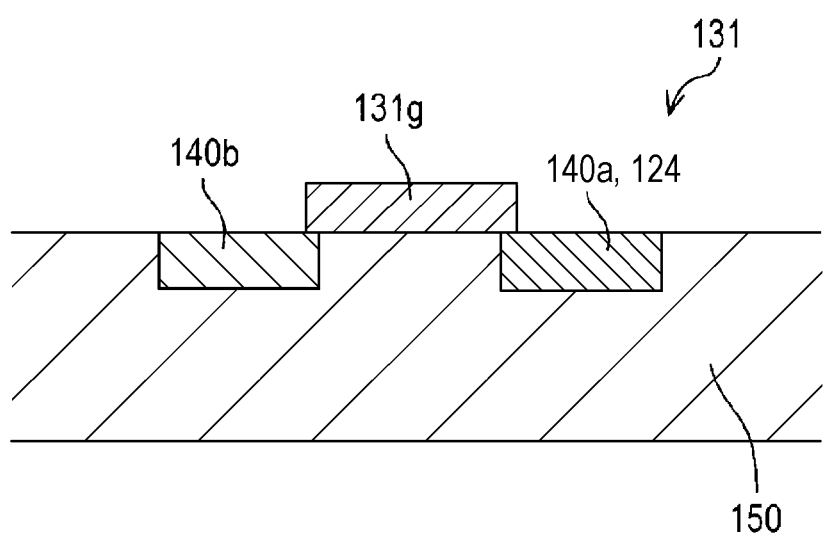
FIG. 10B is a cross section of the reset transistor.

FIG. 10B illustrates a cross section of the reset transistor 131 according to the present embodiment. As FIG. 10B demonstrates, the reset transistor 131 is an enhancement-mode transistor. Specifically, the reset transistor 131 is an enhancement-mode MOSFET. The same also applies to the feedback transistor 132 and the transfer transistor 137.

However, the amplification transistor 126 may be a depletion-mode transistor (specifically a depletion-mode MOSFET) or an enhancement-mode transistor (specifically an enhancement-mode MOSFET). The same also applies to the select transistor 125, the reset transistor 131, the feedback transistor 132, and the transfer transistor 137.

<Specific Configuration Example of Amplification Transistor 126>

Hereinafter, FIGS. 11A to 16C will be referenced to describe a specific configuration example of the amplification transistor 126 while also mentioning a method of producing the configuration. FIGS. 11A to 16C are diagrams viewing the amplification transistor 126 and the like from a direction perpendicular to the surface of the semiconductor substrate 150. Consequently, in the following description, the phrase "in a plan view" may be supplemented where appropriate.

In the following description, the terms "first conductivity type" and "second conductivity type" are used. The first conductivity type and the second conductivity type are mutually different conductivity types. Specifically, in the following example, the first conductivity type is n-type and the second conductivity type is p-type. However, the case where the first conductivity type is the p-type and the second conductivity type is the n-type is also possible.

In the following description, an impurity of the first conductivity type is arsenic (As). An impurity of the second conductivity type is boron. However, other impurities may also be used as the impurity of the first conductivity type and the impurity of the second conductivity type. Phosphorus (P) is another example of an impurity of the first conductivity type.

Figure 11A:
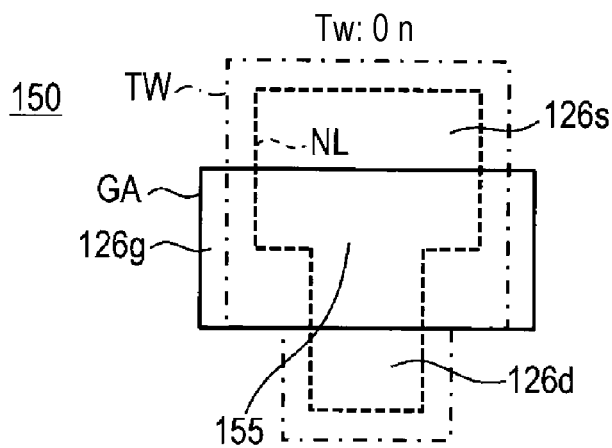
FIG. 11A is an explanatory diagram of a simulated amplification transistor.
Figure 11B:
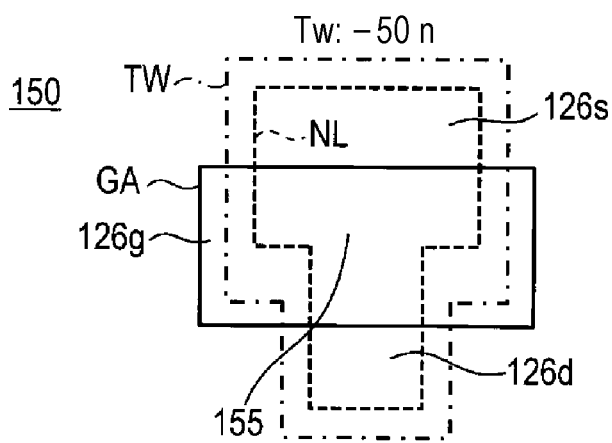
FIG. 11B is an explanatory diagram of a simulated amplification transistor.
Figure 11C:
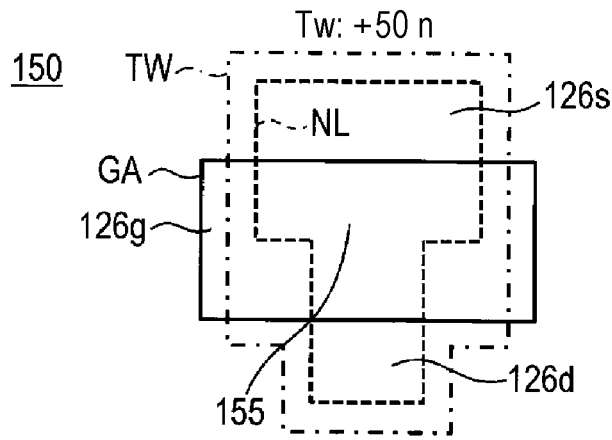
FIG. 11C is an explanatory diagram of a simulated amplification transistor.
Figure 12A:
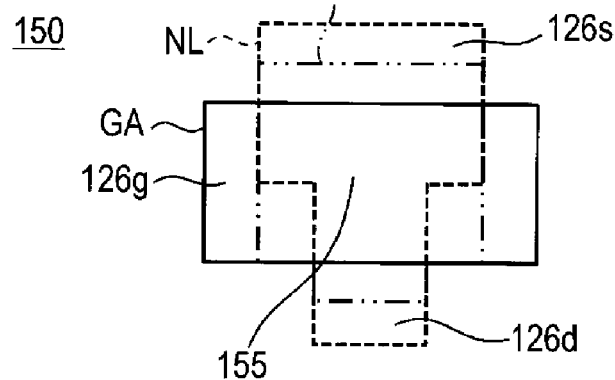
FIG. 12A is an explanatory diagram of a simulated amplification transistor.
Figure 12B:
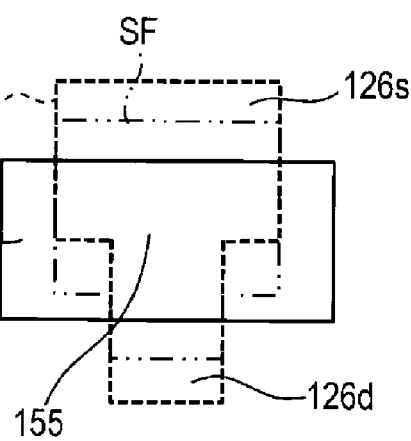
FIG. 12B is an explanatory diagram of a simulated amplification transistor.

A method of producing the amplification transistor 126 will be described with reference to FIGS. 11A to 12B. Note that in the following, FIGS. 11A to 11C are separate from FIGS. 12A and 12B to make the diagrams easier to see. When producing the amplification transistor 126, the step described in any of FIGS. 11A to 11C and the step described in any of FIGS. 12A and 12B are both performed.

In FIGS. 11A to 12B, the region inside the solid line GA is the region over which the gate electrode 126g of the amplification transistor 126 spreads.

In FIGS. 11A to 11C, the region outside the chain line TW is the region in which the impurity of the second conductivity type is implanted. Specifically, the impurity of the second conductivity type is implanted into the region of the semiconductor substrate 150 outside the chain line TW before the gate electrode 126g is disposed. Hereinafter, the above implantation is referred to as the first implantation.

Through the first implantation, an implantation isolation region that isolates the amplification transistor 126 is formed in the semiconductor substrate 150. Note that a certain element being isolated means that a structure for inhibiting electrical interactions between the element and other elements is provided between the elements. In one example, a certain element being isolated means that the element is surrounded by the structure described above in a plan view, and other elements are disposed on the outside of the structure.

In FIGS. 12A and 12B, the region inside the chain double-dashed line SF is the region in which the impurity of the first conductivity type is implanted. Specifically, the impurity of the first conductivity type is implanted into the region of the semiconductor substrate 150 inside the chain double-dashed line SF before the gate electrode 126g is disposed. Hereinafter, the above implantation is referred to as the second implantation.

In FIGS. 11A to 12B, the region inside the dashed line NL is the region in which the impurity of the first conductivity type is implanted. Specifically, the impurity of the first conductivity type is implanted toward the region of the semiconductor substrate 150 inside the dashed line NL after the gate electrode 126g is disposed. In other words, the impurity of the first conductivity type is implanted toward the region of the semiconductor substrate 150 inside the dashed line NL while the gate electrode 126g is in a masked state. Hereinafter, the above implantation is referred to as the third implantation.

The quantity of impurity implanted per unit area of the semiconductor substrate 150 by the third implantation is sufficiently large compared to the quantity of impurity implanted per unit area of the semiconductor substrate 150 by the second implantation. Consequently, in the semiconductor substrate 150, the impurity concentration in the region where the impurity is introduced by the third implantation is sufficiently large compared to the impurity concentration in the region where the impurity is introduced by the second implantation but not introduced by the third implantation. In the semiconductor substrate 150, the impurity concentration in the region where the impurity is introduced by both the third implantation and the second implantation may be considered to be substantially determined by the third implantation.

The source 126s of the amplification transistor 126 is formed by the third implantation into the region on one side of the semiconductor substrate 150 as seen from the gate electrode 126g. The drain 126d of the amplification transistor 126 is formed by the third implantation into the region on the other side of the semiconductor substrate 150 as seen from the gate electrode 126g.

An implantation region 155 is formed in the region where the impurity is introduced by the second implantation but not introduced by the third implantation. The doping concentration of the implantation region 155 is low compared to the doping concentration of the source 126s and the drain 126d. The implantation region 155 extends between the source 126s and the drain 126d. By forming the implantation region 155, the threshold voltage VTop of the amplification transistor 126 is adjusted. Here, the threshold voltage VTop refers to the gate-source voltage of the amplification transistor 126 when a drain current begins to flow through the amplification transistor 126.

In this example, the conductivity type of the impurity included in the source 126s and the drain 126d is the same as the conductivity type of the impurity included in the implantation region 155, namely the first conductivity type. In this example, the second implantation is what is called counter implantation. With this arrangement, a depletion-mode amplification transistor 126 is formed. However, the conductivity type of the impurity included in the source 126s and the drain 126d may be different from the conductivity type of the impurity included in the implantation region 155.

The amplification transistor 126 is produced through multiple steps including the first implantation, the second implantation, and the third implantation. The first implantation may be performed according to any of FIG. 11A, 11B, or 11C. The second implantation may be performed according to either FIG. 12A or 12B.

In the examples of FIGS. 11A to 11C, the first implantation is performed in different regions.

Specifically, in the example of FIG. 11A, the outline of the region of the first implantation includes a portion extending on top of the outline of the gate electrode 126g on the drain 126d side, as demonstrated by the chain line TW. In other words, the outline of the region of the first implantation partially overlaps with (in other words, is onset with) the outline of the gate electrode 126g on the drain 126d side. Hereinafter, the case of forming the implantation isolation region according to the example in FIG. 11A may be designated "TW: 0 n".

In the example of FIG. 11B, the outline of the region of the first implantation includes a portion offset 50 nm inwardly into the gate electrode 126g from the outline of the gate electrode 126g on the drain 126d side, as demonstrated by the chain line TW. Hereinafter, the case of forming the implantation isolation region according to the example in FIG. 11B may be designated "TW: −50 n".

In the example of FIG. 11C, the outline of the region of the first implantation includes a portion offset 50 nm outwardly from the gate electrode 126g from the outline of the gate electrode 126g on the drain 126d side, as demonstrated by the chain line TW. Hereinafter, the case of forming the implantation isolation region according to the example in FIG. 11C may be designated "TW: +50 n".

In the examples of FIGS. 12A and 12B, the second implantation is performed in different regions.

Specifically, in the example of FIG. 12A, the outline of the region of the second implantation includes a portion extending on top of the outline of the gate electrode 126g on the drain 126d side, as demonstrated by the chain double-dashed line SF. In other words, the outline of the region of the second implantation is partially onset with the outline of the gate electrode 126g on the drain 126d side. Hereinafter, the case of forming the implantation region 155 according to the example in FIG. 12A may be designated "SF: 0 n".

In the example of FIG. 12B, the outline of the region of the second implantation includes a portion offset 50 nm inwardly into the gate electrode 126g from the outline of the gate electrode 126g on the drain 126d side, as demonstrated by the chain double-dashed line SF. Hereinafter, the case of forming the implantation region 155 according to the example in FIG. 12B may be designated "SF: −50 n".

Figure 13:
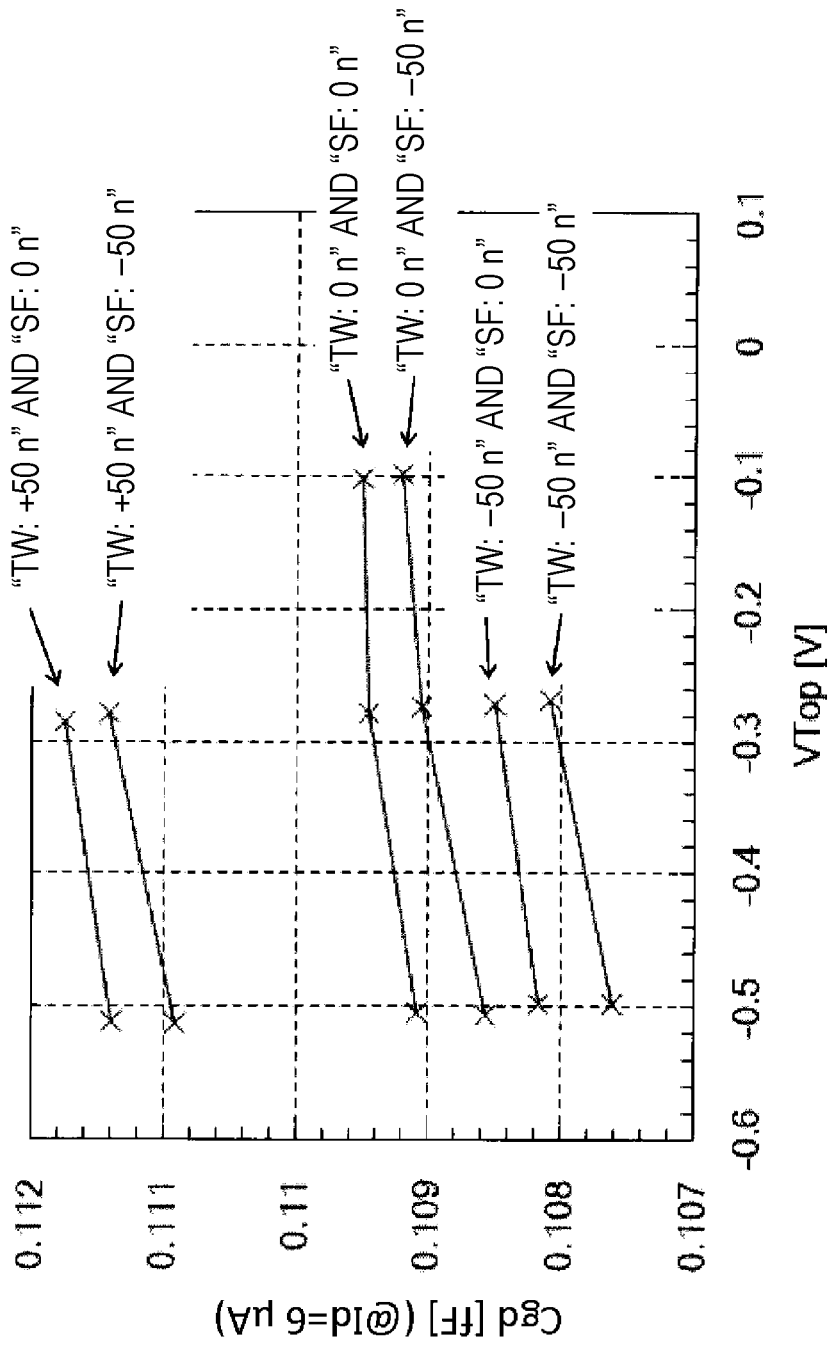
FIG. 13 is a graph showing the relationship, obtained by simulation, between the threshold voltage VTop of the amplification transistor and the gate-drain capacitance Cgd of the amplification transistor.
Figure 14:
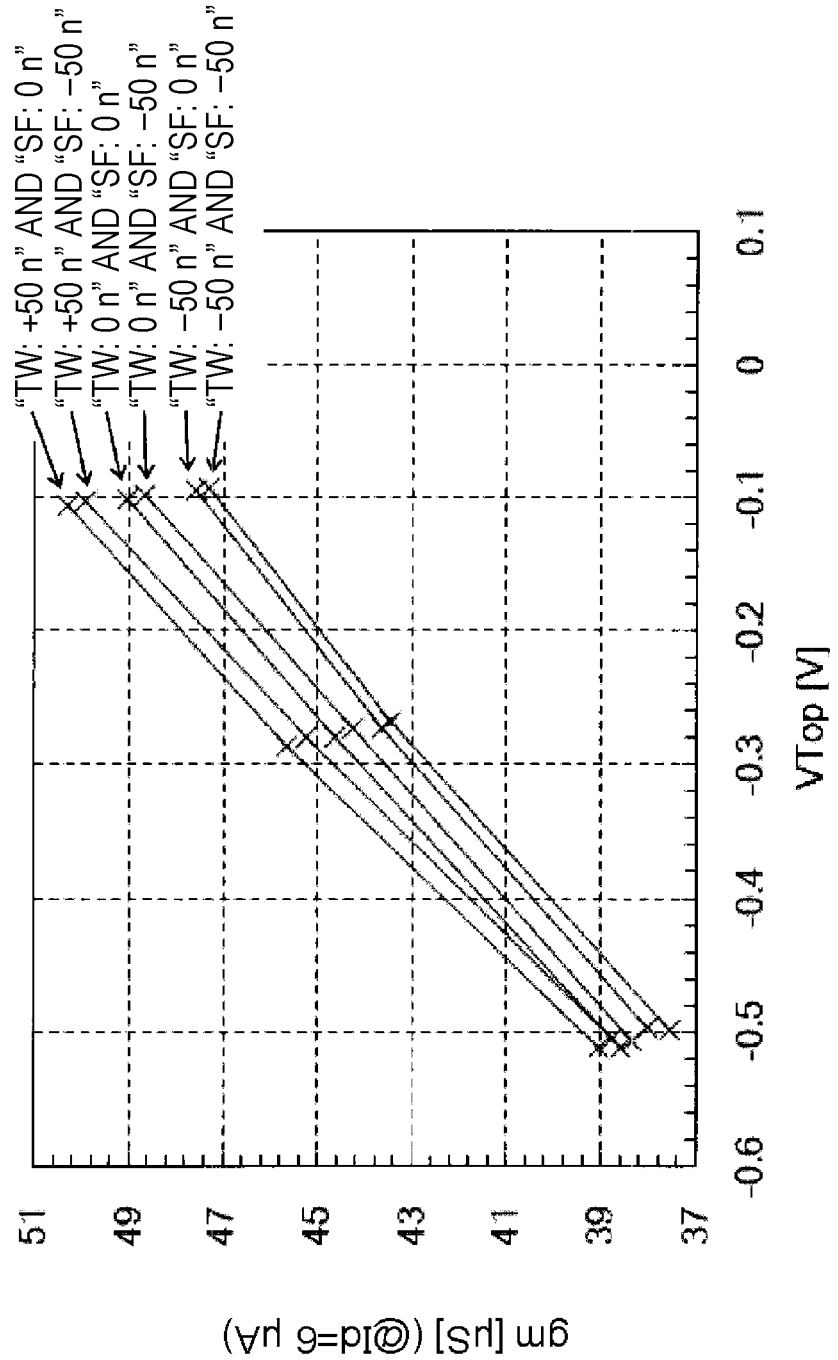
FIG. 14 is a graph showing the relationship, obtained by simulation, between the threshold voltage VTop of the amplification transistor and the transconductance gm of the amplification transistor.

FIGS. 13 and 14 illustrate the properties of the amplification transistor 126 for the case of "TW: 0 n" and "SF: 0 n", the case of "TW: 0 n" and "SF: −50 n", the case of "TW: −50 n" and "SF: 0 n", the case of "TW: −50 n" and "SF: −50 n", the case of "TW: +50 n" and "SF: 0 n", and the case of "TW: +50 n" and "SF: −50 n". FIGS. 13 and 14 illustrate data obtained from simulations of the above six cases. In the simulations, the drain current Id of the amplification transistor 126 is set to 6 μA.

In FIG. 13, the horizontal axis is the threshold voltage VTop (units: V) of the amplification transistor 126. The vertical axis is the gate-drain capacitance Cgd (units: fF) of the amplification transistor 126. From FIG. 13, it can be seen that the gate-drain capacitance Cgd is substantially the same in the above six cases.

Specifically, in FIG. 13, a graph of "TW: +50 n" and "SF: 0 n", a graph of "TW: +50 n" and "SF: −50 n", a graph of "TW: 0 n" and "SF: 0 n", a graph of "TW: 0 n" and "SF: −50 n", a graph of "TW: −50 n" and "SF: 0 n", and a graph of "TW: −50 n" and "SF: −50 n" are arranged in the above order from top to bottom. However, the gate-drain capacitance Cgd illustrated by these graphs is substantially the same.

In FIG. 14, the horizontal axis is the threshold voltage VTop (units: V) of the amplification transistor 126. The vertical axis is the transconductance gm (units: μS) of the amplification transistor 126. From FIG. 14, it can be seen that a large transconductance gm is obtained in the case where "TW: +50 n". It can also be seen that a large transconductance gm is obtained in the case where "SF: 0 n".

Specifically, in FIG. 14, a graph of "TW: +50 n" and "SF: 0 n", a graph of "TW: +50 n" and "SF: −50 n", a graph of "TW: 0 n" and "SF: 0 n", a graph of "TW: 0 n" and "SF: −50 n", a graph of "TW: −50 n" and "SF: 0 n", and a graph of "TW: −50 n" and "SF: −50 n" are arranged in the above order from top to bottom. There are differences in the transconductance gm as expressed in these graphs.

It is inferred from FIG. 14 that a large gm is easily obtained in the case where the outline of the region of the first implantation includes a portion offset outwardly from the gate electrode 126g from the outline of the gate electrode 126g on the drain 126d side. Specifically, it is inferred that a large gm with respect to the same threshold voltage VTop is easily obtained in this case.

It is inferred from FIG. 14 that a large gm is easily obtained in the case where the outline of the region of the second implantation is partially onset with the outline of the gate electrode 126g on the drain 126d side. Specifically, it is inferred that a large gm with respect to the same threshold voltage VTop is easily obtained in this case.

FIGS. 15A, 15B, 16A, and 16B are contour diagrams obtained by simulation.

Figure 15A:
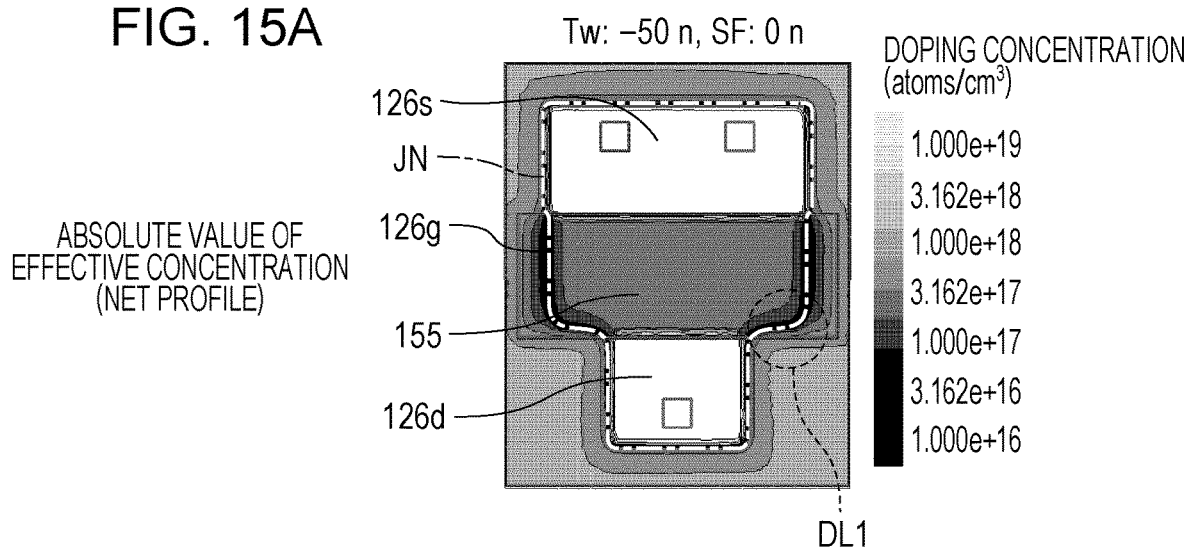
FIG. 15A is a contour diagram illustrating the distribution of doping concentration.
Figure 16A:
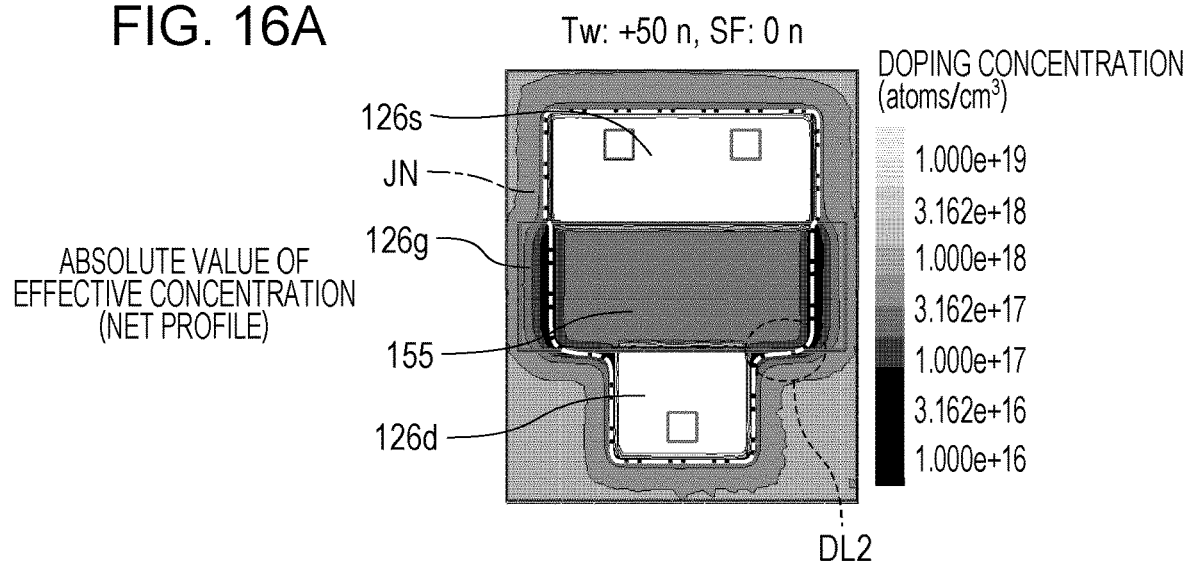
FIG. 16A is a contour diagram illustrating the distribution of doping concentration.

FIG. 15A illustrates the doping concentration near the surface of the semiconductor substrate 150 in the case of "TW: −50 n" and "SF: 0 n". FIG. 16A illustrates the doping concentration near the surface of the semiconductor substrate 150 in the case of "TW: +50 n" and "SF: 0 n". Note that FIGS. 15A and 16A illustrate the absolute value of the effective impurity concentration (net profile). Here, the effective impurity concentration refers to the concentration of electrically active impurities.

In FIGS. 15A and 16A, the chain line JN illustrates the junction, or in other words, the portion where the concentration of the impurity of the first conductivity type and the concentration of the impurity of the second conductivity type are equal. The junction JN extends linearly.

In FIGS. 15A and 16A, the contour bar labeled "Doping Concentration" indicates the concentration of the impurity of the first conductivity type for the region enclosed by the junction JN. The contour bar labeled "Doping Concentration" indicates the concentration of the impurity of the second conductivity type for the region outside the region enclosed by the junction JN. Note that the units of the numerical values on the contour bar are atoms/cm$^3$.

A comparison between FIG. 15A and FIG. 16A reveals that the region of the first implantation affects the position of the junction JN. This is because the thermal diffusion of the impurity of the second conductivity type implanted by the first implantation is reflected in the simulation.

For convenience, a dashed line DL1 is added to FIG. 15A illustrating the case of "TW: −50 n" and "SF: 0 n". In this case, as illustrated in the region enclosed by the dashed line DL1, the junction JN includes a portion extending along the contour line of the gate electrode 126g farther inward into the gate electrode 126g than the contour line on the drain 126d side.

For convenience, a dashed line DL2 is added to FIG. 16A illustrating the case of "TW: +50 n" and "SF: 0 n". In this case, as illustrated in the region enclosed by the dashed line DL2, the junction JN includes a portion onset with the contour line of the gate electrode 126g on the drain 126d side.

Figure 15B:
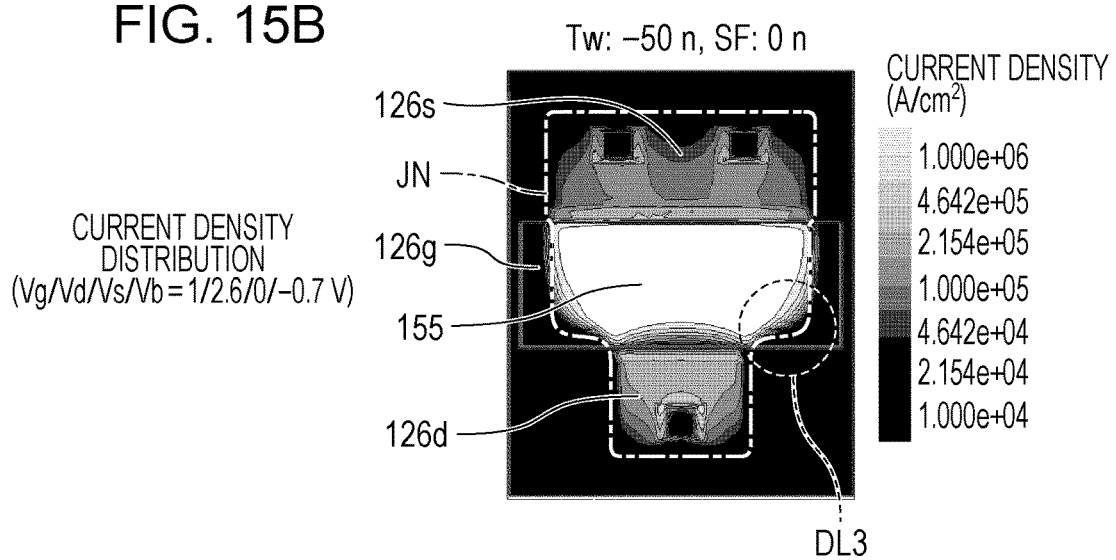
FIG. 15B is a contour diagram illustrating the distribution of current density.

FIG. 15B illustrates the current density distribution (units: A/cm$^2$) near the surface of the semiconductor substrate 150 in the case of "TW: −50 n" and "SF: 0 n". In other words, FIG. 15B illustrates the current density distribution for the case of FIG. 15A. FIG. 15B illustrates the same junction JN as FIG. 15A.

Figure 16B:
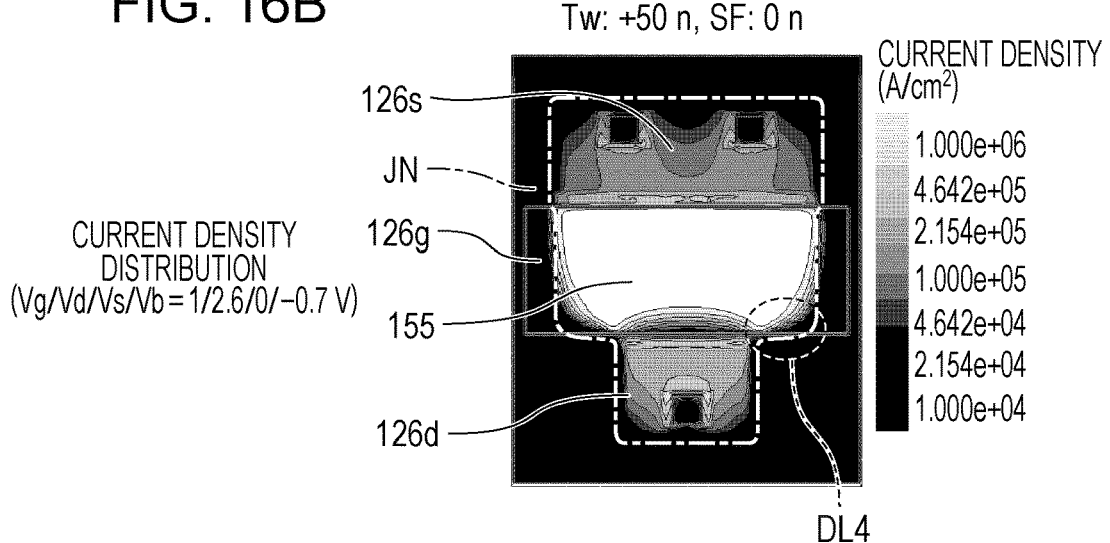
FIG. 16B is a contour diagram illustrating the distribution of current density.

FIG. 16B illustrates the current density distribution (units: A/cm$^2$) near the surface of the semiconductor substrate 150 in the case of "TW: +50 n" and "SF: 0 n". In other words, FIG. 16B illustrates the current density distribution for the case of FIG. 16A. FIG. 16B illustrates the same junction JN as FIG. 16A.

The current density distributions illustrated in FIGS. 15B and 16B were obtained by setting the various voltages of the amplification transistor 126 as follows in the simulation.

Gate voltage Vg: 1 V
Drain voltage Vd: 2.6 V
Source voltage Vs: 0 V
Back bias voltage Vb: −0.7 V For convenience, a dashed line DL3 is added to FIG. 15B illustrating the current density distribution for the case of "TW: −50 n" and "SF: 0 n". For convenience, a dashed line DL4 is added to FIG. 16B illustrating the current density distribution for the case of "TW: +50 n" and "SF: 0 n". From a comparison between the region enclosed by the dashed line DL3 and the region enclosed by the dashed line DL4, it can be seen that the current path is wider in the case of "TW: +50 n" and "SF: 0 n" compared to the case of "TW: −50 n" and "SF: 0 n". The above demonstrates that the inclusion of a portion of the junction JN that is onset with the outline of the gate electrode 126g on the drain 126d side contributes to the securing of a wide current path.

Note that although FIGS. 15A and 16A illustrate the doping concentration near the surface of the semiconductor substrate 150, the doping concentration is thought to be substantially the same on the surface of the semiconductor substrate 150. Also, although FIGS. 15B and 16B illustrate the current density distribution near the surface of the semiconductor substrate 150, the current density distribution is thought to be substantially the same on the surface of the semiconductor substrate 150.

Figure 15C:
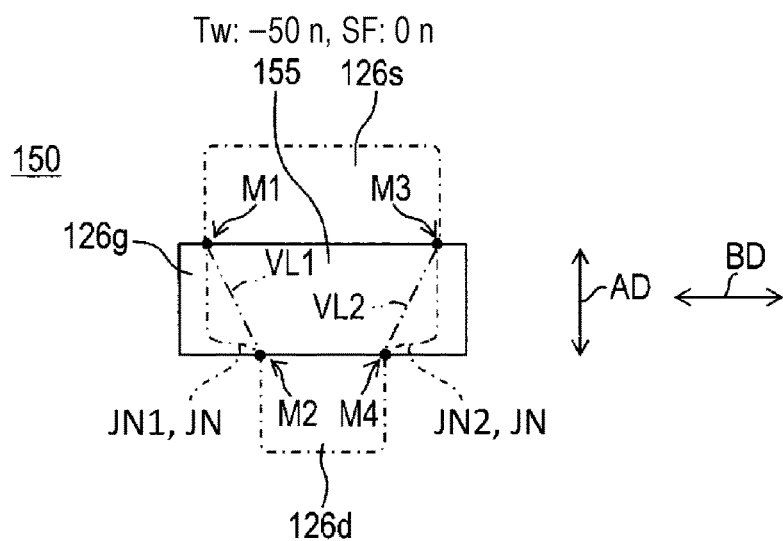
FIG. 15C is an explanatory diagram of junction positions.
Figure 16C:
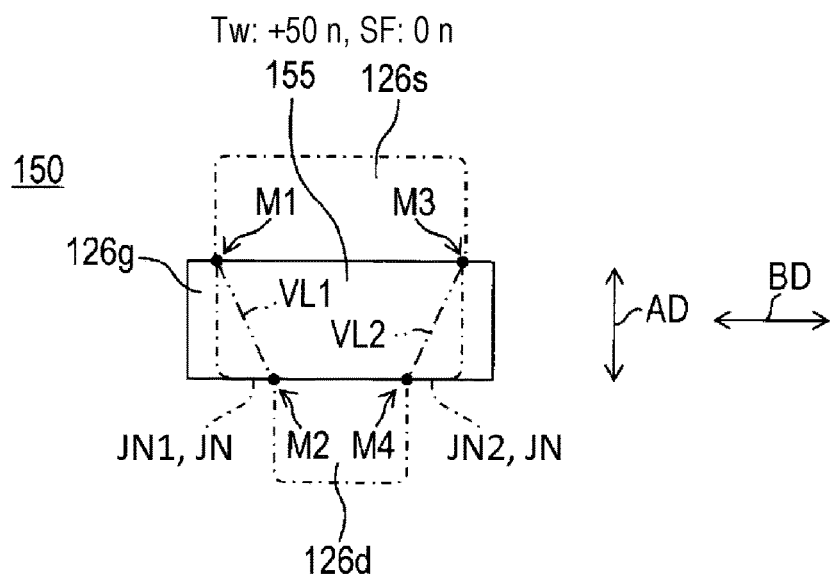
FIG. 16C is an explanatory diagram of junction positions.

FIG. 15C is a diagram for explaining the position of the junction JN on the surface of the semiconductor substrate 150 according to an embodiment derived from FIG. 15A and 15B. FIG. 16C is a diagram for explaining the position of the junction JN on the surface of the semiconductor substrate 150 according to an embodiment derived from FIGS. 16A and 16B.

In the examples of FIGS. 15C and 16C, on the surface of the semiconductor substrate 150, the junction JN extends to pass through a portion of the outline of the source 126s of the amplification transistor 126 and a portion of the outline of the drain 126d of the amplification transistor 126. On the surface of the semiconductor substrate 150, the junction JN includes a first line JN1 joining the source 126s of the amplification transistor 126 and the drain 126d of the drain 126d, and a second line JN2 joining the source 126s of the amplification transistor 126 and the drain 126d of the amplification transistor 126.

Here, the straight line joining the ends of the first line JN1 on the surface of the semiconductor substrate 150 is defined as a first straight line VL1. The straight line joining the ends of the second line JN2 on the surface of the semiconductor substrate 150 is defined as a second straight line VL2. Here, the area of the region between the first line JN1 and the second line JN2 on the surface of the semiconductor substrate 150 is larger than the area of the region between the first straight line VL1 and the second straight line VL2. This configuration is advantageous from the perspective of securing a wide current path. In the examples illustrated in the drawings, a wide current path is secured by curving the first line JN1 and the second line JN2 on the surface of the semiconductor substrate 150.

The above configuration will be described strictly. Let a first end M1 and a second end M2 be defined as one end and the other end of the first line JN1 on the surface of the semiconductor substrate 150. Let a third end M3 and a fourth end M4 be defined as one end and the other end of the second line JN2 on the surface of the semiconductor substrate 150. Let a first area be defined as the area of the region enclosed by the first line JN1, the second line JN2, a straight line joining the first end M1 and the third end M3, and a straight line joining the second end M2 and the fourth end M4 on the surface of the semiconductor substrate 150. Let a second area be defined as the area of the region enclosed by the first straight line VL1, the second straight line VL2, the straight line joining the first end M1 and the third end M3, and the straight line joining the second end M2 and the fourth end M4 on the surface of the semiconductor substrate 150. Here, the first area is greater than the second area.

In the example of FIG. 16C, the junction JN on the surface of the semiconductor substrate 150 includes a portion onset with the outline of the gate electrode 126g at a position closer to the drain 126d than the source 126s in a plan view. This configuration is advantageous from the perspective of securing a wide current path. Specifically, the junction JN on the surface of the semiconductor substrate 150 includes a portion onset with the outline of the gate electrode 126g at a position adjacent to the drain 126d in a plan view.

As is understood from the above description, the depletion-mode amplification transistor 126 may include the implantation region 155. In the above examples, the implantation region 155 includes an impurity of the same conductivity type as the conductivity type of the impurity included in the source 126s and the drain 126d. The implantation region 155 is connected to the source 126s and the drain 126d. In a typical example, the impurity concentration in the implantation region 155 is lower than the impurity concentration in the source 126s and also lower than the impurity concentration in the drain 126d. In the examples of FIGS. 15C and 16C, the first line JN1 and the second line JN2 correspond to the outline of the implantation region 155 on the surface of the semiconductor substrate 150.

In the examples of FIGS. 15C and 16C, on the surface of the semiconductor substrate 150, the average width of the implantation region 155 is greater than the average of the width Ws of the source 126s and the width Wd of the drain 126d. This configuration is advantageous from the perspective of securing a wide current path. Here, the average of the width Ws of the source 126s and the width Wd of the drain 126d is the value obtained by adding together the width Ws of the source 126s and the width Wd of the drain 126d and then dividing by 2. The definitions of the width Ws of the source 126s and the width Wd of the drain 126d are as described earlier. The average width of the implantation region 155 is the value obtained by dividing the area of the implantation region 155 by the minimum interval between the source 126s and the drain 126d.

The feature can also be described using the average interval between the first line JN1 and the second line JN2 instead of the average width of the implantation region 155. In the examples of FIGS. 15C and 16C, on the surface of the semiconductor substrate 150, the average interval between the lines JN1 and JN2 is greater than the average of the width Ws of the source 126s and the width Wd of the drain 126d. The average interval between the lines JN1 and JN2 is the value obtained by dividing the area between the lines JN1 and JN2 by the minimum interval between the source 126s and the drain 126d.

In FIGS. 15C and 16C, a separation direction AD and an orthogonal direction BD are illustrated by arrows. The separation direction AD is the direction prescribing the minimum interval between the source 126s and the drain 126d on the surface of the semiconductor substrate 150. The orthogonal direction BD is the direction orthogonal to the separation direction AD on the surface of the semiconductor substrate 150. In the examples of FIGS. 15C and 16C, the width of the implantation region 155 is the dimension of the implantation region 155 in the orthogonal direction BD on the surface of the semiconductor substrate 150.

On the surface of the semiconductor substrate 150, the distance proceeding from the source 126s to the drain 126d in the separation direction AD in the implantation region 155 is defined as an advancement distance $\Delta L$, and the ratio of the reduction $\Delta W$ in the width of the implantation region 155 with respect to the advancement distance $\Delta L$ is defined as a width reduction ratio $\Delta W/\Delta L$. Here, in the examples of FIGS. 15C and 16C, on the surface of the semiconductor substrate 150, the position in the separation direction AD where the width reduction ratio $\Delta W/\Delta L$ is maximized is closer to the position of the second end M2 in the separation direction AD than the position of the first end M1 in the separation direction AD. Also, on the surface of the semiconductor substrate 150, the position in the separation direction AD where the width reduction ratio $\Delta W/\Delta L$ is maximized is closer to the position of the fourth end M4 in the separation direction AD than the position of the third end M3 in the separation direction AD. In the examples of FIGS. 15C and 16C, both of these features related to the position where the width reduction ratio $\Delta W/\Delta L$ is maximized hold true, but it is also possible for only one of the features to hold true.

The concept of differentiation can be used to calculate the width reduction ratio $\Delta W/\Delta L$. Accordingly, infinitesimal values can be used as the width reduction $\Delta W$ and the advancement distance $\Delta L$.

The feature can also be described using the curvature of the first line JN1 and the second line JN2 instead of the width reduction ratio $\Delta W/\Delta L$. In the examples of FIGS. 15C and 16C, on the surface of the semiconductor substrate 150, the position in the separation direction AD where the curvature of the first line JN1 is maximized is closer to the position of the second end M2 in the separation direction AD than the position of the first end M1 in the separation direction AD. Also, on the surface of the semiconductor substrate 150, the position in the separation direction AD where the curvature of the second line JN2 is maximized is closer to the position of the fourth end M4 in the separation direction AD than the position of the third end M3 in the separation direction AD. In the examples of FIGS. 15C and 16C, both of these features related to the position where the curvature of the lines JN1 and JN2 is maximized hold true, but it is also possible for only one of the features to hold true.

<Example Using Different Photoelectric Conversion Unit>

Figure 18:
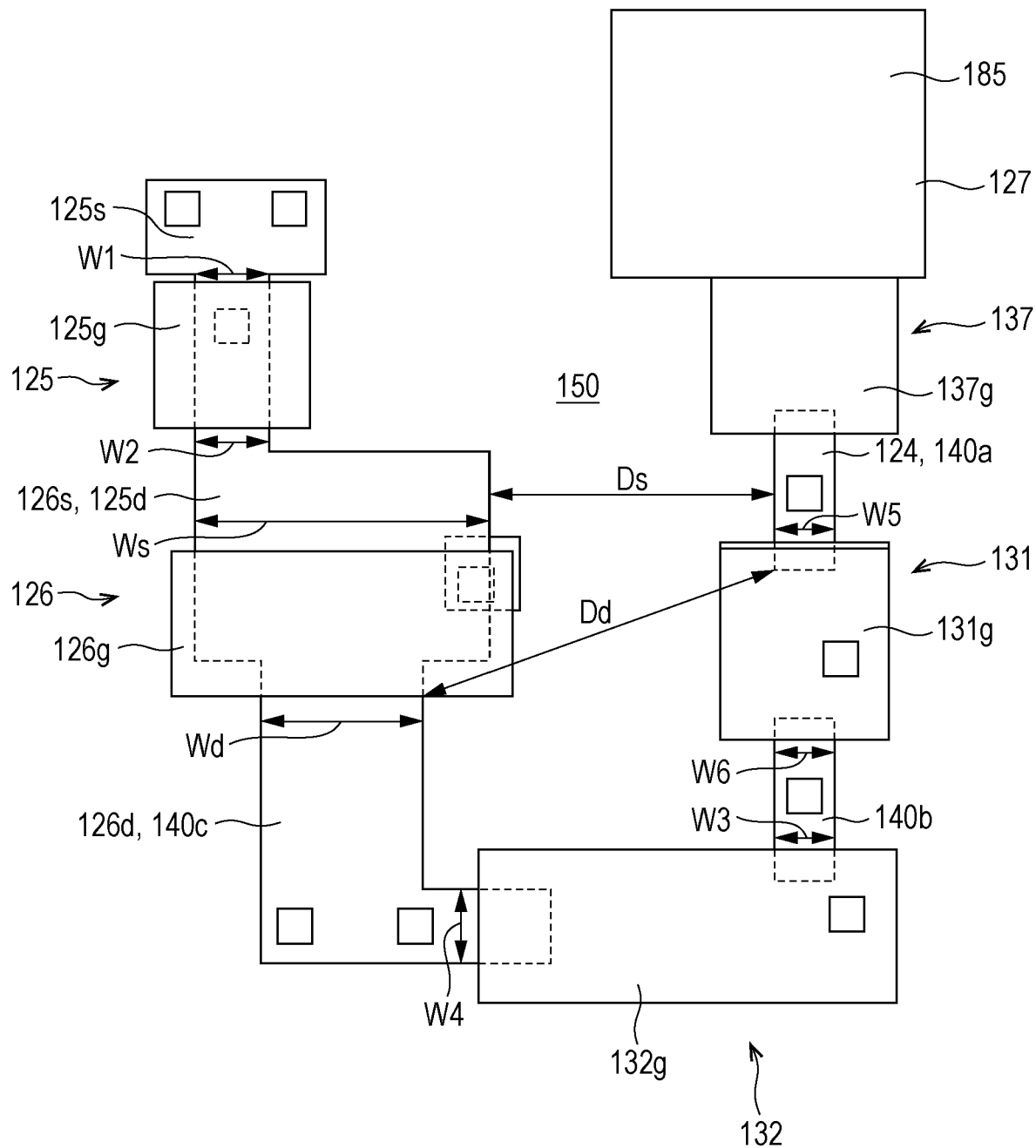
FIG. 18 is a plan view illustrating the arrangement of transistors.

Hereinafter, an example of using a photoelectric conversion unit 127 different from the photoelectric conversion unit 121 will be described with reference to FIGS. 17 and 18. Note that this example may also be combined with the content described above in non-contradictory ways.

In this example, the photoelectric conversion unit 127 is positioned inside the semiconductor substrate 150. Specifically, in this example, a photodiode is used as the photoelectric conversion unit 127.

Also, in this example, a pixel 201 includes the transfer transistor 137. The transfer transistor 137 is included in a readout circuit 222.

The photoelectric conversion unit 127 configured as a photodiode includes an impurity region 185 of a first conductivity type and a pinning layer. In this example, the first conductivity type is n-type.

The pinning layer is positioned above the impurity region 185. The pinning layer is an impurity region of a second conductivity type. The second conductivity type is different from the first conductivity type. In this example, the second conductivity type is p-type. In FIGS. 17 and 18, the pinning layer is omitted from illustration.

The photoelectric conversion unit 127 configured as a photodiode generates charge by photoelectrically converting light received in an exposure period. After the predetermined exposure period ends, a transfer signal is applied to the gate of the transfer transistor 137 through a signal line CONT. With this arrangement, the transfer transistor 137 is turned on and the charge generated by the photoelectric conversion unit 127 configured as a photodiode is transferred to the charge storage unit 124. In a typical example, the transfer is a complete transfer in which all or substantially all of the charge is transferred.

The amplification transistor 126 outputs a signal corresponding to the charge transferred to the charge storage unit 124 to the signal line 111 through the select transistor 125. The outputted signal may be subjected to signal processing such as AD conversion.

The transfer transistor 137 includes the charge storage unit 124 as the other of the source or the drain. The transfer transistor 137 includes the impurity region 185 as one of the source or the drain. Also, the transfer transistor 137 includes a gate electrode 137g. The transfer transistor 137 shares the charge storage unit 124 with the reset transistor 131.

Modified Embodiment

In a modified embodiment, the source and the drain may switch places in the amplification transistor 126. In one specific example of this modified embodiment, the imaging apparatus 100 has a first operating mode and a second operating mode. In the first operating mode, the source and the drain do not switch places in the amplification transistor 126. In the second operating mode, the source and the drain may switch places in the amplification transistor 126. The same also applies to the select transistor 125. For example, the first operating mode is a mode accommodating a relatively high demand for low noise, while the second operating mode is a mode accommodating a relatively low demand for low noise.

Descriptive statements regarding the embodiment described earlier may also be applied to the modified embodiment in non-contradictory ways. For example, the descriptive statement "the width Wd of the drain 126d of the amplification transistor 126 is less than the width Ws of the source 126s of the amplification transistor 126 in a plan view" may be considered to also hold true for the modified embodiment.

As is understood from the content and language in the foregoing embodiment and the modified embodiment, in this specification, the descriptive statement "the width Wd of the drain 126d of the amplification transistor 126 is less than the width Ws of the source 126s of the amplification transistor 126 in a plan view" should be interpreted as meaning that the imaging apparatus 100 has an operating mode in which the descriptive statement holds true. Other descriptive statements should also be interpreted as meaning that the imaging apparatus 100 has an operating mode in which the descriptive statement holds true. There may be one or a plurality of operating modes included in the imaging apparatus 100.

A configuration in which the source and the drain of the reset transistor 131 do not switch places may also be adopted. A configuration in which the source and the drain of the feedback transistor 132 do not switch places may also be adopted. A configuration in which the source and the drain of the transfer transistor 137 do not switch places may also be adopted.

Various modifications can be applied to the present disclosure. For example, providing negative feedback is not required. In this case, components such as the feedback transistor 132, the capacitive element 133, and the capacitive element 134 in FIGS. 2, 9, 17, and 18 may be omitted.

The imaging apparatus according to the present disclosure is useful in equipment such as image sensors and digital cameras, for example. The imaging apparatus according to the present disclosure can be used in equipment such as a medical camera, a robot camera, a security camera, or a camera used onboard a vehicle.

What is claimed is:

1. An imaging apparatus comprising:
   a semiconductor substrate;
   a photoelectric converter including a pixel electrode, a counter electrode, and a photoelectric conversion layer positioned above the semiconductor substrate and disposed between the pixel electrode and the counter electrode;
   a charge storage region that stores charge generated by the photoelectric converter; and
   an amplification transistor including a first source, a first drain, and a gate electrode electrically connected to the charge storage region, wherein
   in a plan view, a width of the first drain is less than a width of the first source, the width direction being perpendicular to the direction in which the first source, the gate electrode, and the first drain are aligned.

2. The imaging apparatus according to claim 1, wherein in a plan view, a distance from the first drain to the charge storage region is greater than a distance from the first source to the charge storage region.

3. The imaging apparatus according to claim 1, wherein the amplification transistor and the charge storage region are arranged such that an output signal from the amplification transistor is provided to the charge storage region as negative feedback.

4. The imaging apparatus according to claim 1, further comprising:
   a select transistor including a second source and a second drain, the select transistor determining a timing at which the amplification transistor outputs an output signal, wherein
   in a plan view, a width of at least one selected from the group consisting of the second source and the second drain is less than the width of the first drain of the amplification transistor.

5. The imaging apparatus according to claim 1, wherein on a surface of the semiconductor substrate,
   a p-n junction including a portion of an outline of the first source, a portion of an outline of the first drain, a first line joining the first source and the first drain, and a second line joining the first source and the first drain is formed, and
   an area of a region between the first line and the second line is greater than an area of a region between a first straight line joining both ends of the first line and a second straight line joining both ends of the second line.

6. The imaging apparatus according to claim 1, wherein the amplification transistor is a depletion-mode transistor, and
   the amplification transistor includes an implantation region including an impurity of the same conductivity type as a conductivity type of an impurity included in the first source and the first drain, the implantation region being connected to the first source and the first drain.

7. The imaging apparatus according to claim 1, wherein the amplification transistor includes an implantation region connected to the first source and the first drain, and
   on a surface of the semiconductor substrate, an average width of the implantation region is greater than an average of the width of the first source and the width of the first drain.

8. An imaging apparatus comprising:
   a semiconductor substrate;
   a photoelectric converter positioned in the semiconductor substrate;
   a charge storage region that stores charge generated by the photoelectric converter; and
   an amplification transistor including a first source, a first drain, and a gate electrode electrically connected to the charge storage region, wherein
   in a plan view,
      a width of the first drain is less than a width of the first source, and
      a distance from the first drain to the charge storage region is greater than a distance from the first source to the charge storage region.

9. The imaging apparatus according to claim 8, wherein the amplification transistor and the charge storage region are arranged such that an output signal from the amplification transistor is provided to the charge storage region as negative feedback.

10. The imaging apparatus according to claim 8, wherein a select transistor including a second source and a second drain, the select transistor determining a timing at which the amplification transistor outputs an output signal, wherein in a plan view, a width of at least one selected from the group consisting of the second source and the second drain is less than the width of the first drain of the amplification transistor.

11. The imaging apparatus according to claim 8, wherein on a surface of the semiconductor substrate,
   a p-n junction including a portion of an outline of the first source, a portion of an outline of the first drain, a first line joining the first source and the first drain, and a second line joining the first source and the first drain is formed, and
   an area of a region between the first line and the second line is greater than an area of a region between a first straight line joining both ends of the first line and a second straight line joining both ends of the second line.

12. The imaging apparatus according to claim 8, wherein the amplification transistor is a depletion-mode transistor, and
   the amplification transistor includes an implantation region including an impurity of the same conductivity type as a conductivity type of an impurity included in the first source and the first drain, the implantation region being connected to the first source and the first drain.

13. The imaging apparatus according to claim 8, wherein the amplification transistor includes an implantation region connected to the first source and the first drain, and
   on a surface of the semiconductor substrate, an average width of the implantation region is greater than an average of the width of the first source and the width of the first drain.

14. The imaging apparatus according to claim 1, wherein the first source and the first drain of the amplification transistor are configured not to switch functions of the first source and the first drain with each other while in operation.

15. The imaging apparatus according to claim 1, wherein the imaging apparatus is configured such that a direct-current potential is supplied to the first drain of the amplification transistor.

16. The imaging apparatus according to claim 8, wherein the first source and the first drain of the amplification transistor are configured not to switch functions of the first source and the first drain with each other while in operation.

17. The imaging apparatus according to claim 8, wherein the imaging apparatus is configured such that a direct-current potential is supplied to the first drain of the amplification transistor.

\* \* \* \* \*